US012592271B2

(12) United States Patent　　(10) Patent No.: US 12,592,271 B2
Akamatsu et al.　　(45) Date of Patent: Mar. 31, 2026

(54) APPARATUSES AND METHODS FOR INCREASED RELIABILITY ROW HAMMER COUNTS

(71) Applicant: MICRON TECHNOLOGY, INC., Boise, ID (US)

(72) Inventors: Hiroshi Akamatsu, Boise, ID (US); Yuan He, Boise, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 224 days.

(21) Appl. No.: 18/481,134

(22) Filed: Oct. 4, 2023

(65) Prior Publication Data

US 2024/0212738 A1　　Jun. 27, 2024

Related U.S. Application Data

(60) Provisional application No. 63/476,732, filed on Dec. 22, 2022.

(51) Int. Cl.
*G11C 11/406*　　(2006.01)
*G11C 11/408*　　(2006.01)
*G11C 29/52*　　(2006.01)
(52) U.S. Cl.
CPC .. *G11C 11/40615* (2013.01); *G11C 11/40622* (2013.01); *G11C 11/4085* (2013.01); *G11C 29/52* (2013.01)
(58) Field of Classification Search
CPC ......................... G11C 11/40615; G11C 11/406
USPC ......................................................... 365/222
See application file for complete search history.

(56) References Cited

U.S. PATENT DOCUMENTS

| | | | |
|---|---|---|---|
| 3,633,175 | A | 1/1972 | Harper |
| 4,679,173 | A | 7/1987 | Sato |
| 5,089,957 | A | 2/1992 | Stultz et al. |
| 5,291,198 | A | 3/1994 | Dingwall et al. |
| 5,299,159 | A | 3/1994 | Balistreri et al. |
| 5,422,850 | A | 6/1995 | Sukegawa et al. |
| 5,617,348 | A | 4/1997 | Maguire |
| 5,638,317 | A | 6/1997 | Tran |

(Continued)

FOREIGN PATENT DOCUMENTS

| | | |
|---|---|---|
| CN | 1144434 A | 3/1997 |
| CN | 1195173 A | 10/1998 |

(Continued)

OTHER PUBLICATIONS

US 11,264,075 B2, 03/2022, Bell et al. (withdrawn)

(Continued)

*Primary Examiner* — Muna A Techane
(74) *Attorney, Agent, or Firm* — Dorsey & Whitney LLP

(57) ABSTRACT

Apparatuses and methods increased reliability row hammer counts. Each word line of a memory may have an associated count value, stored in memory cells of the word line. Information in memory cells may be prone to change, such as from neutron strike. A counter circuit may decrease the count value each time the word line is accessed, since a decreasing count will tend to overestimate accesses due to error. A count error correction circuit may check the count value against redundant information and correct the count value if there is an error. Decreasing counts and count error correction may be used together to further increase reliability.

19 Claims, 9 Drawing Sheets

(56) References Cited

U.S. PATENT DOCUMENTS

| | | | |
|---|---|---|---|
| 5,699,297 A | 12/1997 | Yamazaki et al. | |
| 5,751,655 A | 5/1998 | Yamazaki et al. | |
| 5,768,196 A | 6/1998 | Bloker et al. | |
| 5,874,907 A | 2/1999 | Craft | |
| 5,933,377 A | 8/1999 | Hidaka | |
| 5,943,283 A | 8/1999 | Wong et al. | |
| 5,970,507 A | 10/1999 | Kato et al. | |
| 5,999,471 A | 12/1999 | Choi | |
| 6,002,629 A | 12/1999 | Kim et al. | |
| 6,011,734 A | 1/2000 | Pappert | |
| 6,061,290 A | 5/2000 | Shirley | |
| 6,212,118 B1 | 4/2001 | Fujita | |
| 6,310,806 B1 | 10/2001 | Higashi et al. | |
| 6,317,381 B1 | 11/2001 | Gans et al. | |
| 6,338,154 B2 * | 1/2002 | Kim | G11C 29/20 |
| | | | 365/201 |
| 6,373,738 B1 | 4/2002 | Towler et al. | |
| 6,392,952 B1 | 5/2002 | Chen et al. | |
| 6,424,582 B1 | 7/2002 | Ooishi | |
| 6,434,064 B2 | 8/2002 | Nagai | |
| 6,452,868 B1 | 9/2002 | Fister | |
| 6,480,931 B1 | 11/2002 | Buti et al. | |
| 6,515,928 B2 | 2/2003 | Sato et al. | |
| 6,567,340 B1 | 5/2003 | Nataraj et al. | |
| 6,950,364 B2 | 9/2005 | Kim | |
| 7,027,343 B2 | 4/2006 | Sinha et al. | |
| 7,057,960 B1 | 6/2006 | Fiscus et al. | |
| 7,082,070 B2 | 7/2006 | Hong | |
| 7,187,607 B2 | 3/2007 | Koshikawa et al. | |
| 7,203,113 B2 | 4/2007 | Takahashi et al. | |
| 7,203,115 B2 | 4/2007 | Eto et al. | |
| 7,209,402 B2 | 4/2007 | Shinozaki et al. | |
| 7,215,588 B2 | 5/2007 | Lee | |
| 7,283,380 B1 | 10/2007 | Srinivasan et al. | |
| 7,304,875 B1 | 12/2007 | Lien et al. | |
| 7,319,602 B1 | 1/2008 | Srinivasan et al. | |
| 7,444,577 B2 | 10/2008 | Best et al. | |
| 7,551,502 B2 | 6/2009 | Dono et al. | |
| 7,565,479 B2 | 7/2009 | Best et al. | |
| 7,830,742 B2 | 11/2010 | Han | |
| 7,870,362 B2 | 1/2011 | Hong et al. | |
| 7,872,907 B2 | 1/2011 | Okayama et al. | |
| 8,174,921 B2 | 5/2012 | Kim et al. | |
| 8,400,805 B2 | 3/2013 | Yoko | |
| 8,451,677 B2 | 5/2013 | Okahiro et al. | |
| 8,625,360 B2 | 1/2014 | Iwamoto et al. | |
| 8,676,725 B1 | 3/2014 | Lin et al. | |
| 8,681,578 B2 | 3/2014 | Narui | |
| 8,756,368 B2 | 6/2014 | Best et al. | |
| 8,811,100 B2 | 8/2014 | Ku | |
| 8,862,973 B2 | 10/2014 | Zimmerman et al. | |
| 8,938,573 B2 | 1/2015 | Greenfield et al. | |
| 9,032,141 B2 | 5/2015 | Bains et al. | |
| 9,047,978 B2 | 6/2015 | Bell et al. | |
| 9,058,900 B2 | 6/2015 | Kang | |
| 9,087,554 B1 | 7/2015 | Park | |
| 9,087,602 B2 | 7/2015 | Youn et al. | |
| 9,117,544 B2 | 8/2015 | Bains et al. | |
| 9,123,447 B2 | 9/2015 | Lee et al. | |
| 9,153,294 B2 | 10/2015 | Kang | |
| 9,190,137 B2 | 11/2015 | Kim et al. | |
| 9,190,139 B2 | 11/2015 | Jung et al. | |
| 9,251,885 B2 | 2/2016 | Greenfield et al. | |
| 9,286,964 B2 | 3/2016 | Halbert et al. | |
| 9,299,457 B2 | 3/2016 | Chun et al. | |
| 9,311,985 B2 | 4/2016 | Leo et al. | |
| 9,324,398 B2 | 4/2016 | Jones et al. | |
| 9,384,821 B2 | 7/2016 | Bains et al. | |
| 9,390,782 B2 | 7/2016 | Best et al. | |
| 9,412,432 B2 | 8/2016 | Narui et al. | |
| 9,418,741 B1 | 8/2016 | Ramaraju et al. | |
| 9,424,907 B2 | 8/2016 | Fujishiro | |
| 9,449,675 B2 | 9/2016 | Wheeler | |
| 9,484,079 B2 | 11/2016 | Lee | |
| 9,514,850 B2 | 12/2016 | Kim | |
| 9,570,143 B2 | 2/2017 | Lim et al. | |
| 9,646,672 B1 | 5/2017 | Kim et al. | |
| 9,672,889 B2 | 6/2017 | Lee et al. | |
| 9,685,240 B1 | 6/2017 | Park | |
| 9,691,466 B1 | 6/2017 | Kim | |
| 9,697,913 B1 | 7/2017 | Mariani et al. | |
| 9,734,887 B1 | 8/2017 | Tavva | |
| 9,741,409 B2 | 8/2017 | Jones et al. | |
| 9,741,447 B2 | 8/2017 | Akamatsu | |
| 9,747,971 B2 | 8/2017 | Bains et al. | |
| 9,761,297 B1 | 9/2017 | Tomishima | |
| 9,786,351 B2 | 10/2017 | Lee et al. | |
| 9,799,391 B1 | 10/2017 | Wei | |
| 9,805,782 B1 | 10/2017 | Liou | |
| 9,805,783 B2 | 10/2017 | Ito et al. | |
| 9,818,469 B1 | 11/2017 | Kim et al. | |
| 9,847,118 B1 | 12/2017 | Won | |
| 9,865,326 B2 | 1/2018 | Bains et al. | |
| 9,865,328 B1 | 1/2018 | Desimone et al. | |
| 9,922,694 B2 | 3/2018 | Akamatsu | |
| 9,934,143 B2 | 4/2018 | Bains et al. | |
| 9,953,696 B2 | 4/2018 | Kim | |
| 10,032,501 B2 | 7/2018 | Ito et al. | |
| 10,083,737 B2 | 9/2018 | Bains et al. | |
| 10,090,038 B2 | 10/2018 | Shin | |
| 10,134,461 B2 | 11/2018 | Bell et al. | |
| 10,147,472 B2 | 12/2018 | Jones et al. | |
| 10,153,031 B2 | 12/2018 | Akamatsu | |
| 10,170,174 B1 | 1/2019 | Ito et al. | |
| 10,176,860 B1 | 1/2019 | Mylavarapu | |
| 10,210,925 B2 | 2/2019 | Bains et al. | |
| 10,297,305 B1 | 5/2019 | Moon et al. | |
| 10,339,994 B2 | 7/2019 | Ito et al. | |
| 10,381,327 B2 | 8/2019 | Ramachandra et al. | |
| 10,387,276 B2 | 8/2019 | Ryu et al. | |
| 10,446,216 B2 | 10/2019 | Oh et al. | |
| 10,490,250 B1 | 11/2019 | Ito et al. | |
| 10,490,251 B2 | 11/2019 | Wolff | |
| 10,600,462 B2 | 3/2020 | Augustine et al. | |
| 10,600,491 B2 | 3/2020 | Chou et al. | |
| 10,607,686 B2 | 3/2020 | Akamatsu | |
| 10,629,286 B2 | 4/2020 | Lee et al. | |
| 10,679,710 B2 | 6/2020 | Hirashima et al. | |
| 10,705,900 B2 | 7/2020 | Jin | |
| 10,770,127 B2 | 9/2020 | Shore et al. | |
| 10,811,066 B2 | 10/2020 | Jones et al. | |
| 10,832,792 B1 | 11/2020 | Penney et al. | |
| 10,861,519 B2 | 12/2020 | Jones et al. | |
| 10,867,660 B2 | 12/2020 | Akamatsu | |
| 10,930,335 B2 | 2/2021 | Bell et al. | |
| 10,943,636 B1 | 3/2021 | Wu et al. | |
| 10,950,289 B2 | 3/2021 | Ito et al. | |
| 10,964,378 B2 | 3/2021 | Ayyapureddi et al. | |
| 11,011,215 B1 | 5/2021 | Parry et al. | |
| 11,043,254 B2 | 6/2021 | Enomoto et al. | |
| 11,139,015 B2 | 10/2021 | Brown et al. | |
| 11,152,050 B2 | 10/2021 | Morohashi et al. | |
| 11,158,364 B2 | 10/2021 | Penney et al. | |
| 11,158,373 B2 | 10/2021 | Penney et al. | |
| 11,200,942 B2 | 12/2021 | Jenkinson et al. | |
| 11,222,682 B1 | 1/2022 | Enomoto et al. | |
| 11,257,535 B2 | 2/2022 | Shore et al. | |
| 11,264,096 B2 | 3/2022 | Schreck et al. | |
| 11,322,192 B2 | 5/2022 | Morohashi et al. | |
| 11,361,808 B2 | 6/2022 | Bell et al. | |
| 11,386,946 B2 | 7/2022 | Ayyapureddi et al. | |
| 11,398,265 B2 | 7/2022 | Wu et al. | |
| 11,424,005 B2 | 8/2022 | Penney et al. | |
| 11,462,291 B2 | 10/2022 | Pan | |
| 11,482,275 B2 | 10/2022 | Ayyapureddi et al. | |
| 11,521,669 B2 | 12/2022 | Enomoto et al. | |
| 11,532,336 B2 | 12/2022 | Choi et al. | |
| 11,568,918 B2 | 1/2023 | Ayyapureddi et al. | |
| 11,600,314 B2 | 3/2023 | Ayyapureddi et al. | |
| 11,600,326 B2 | 3/2023 | Schreck et al. | |
| 11,664,063 B2 | 5/2023 | Lovett | |
| 11,688,451 B2 | 6/2023 | Zhang et al. | |
| 11,694,738 B2 | 7/2023 | Morohashi et al. | |
| 11,699,476 B2 | 7/2023 | Brown et al. | |

(56)                References Cited

U.S. PATENT DOCUMENTS

| | | |
|---|---|---|
| 11,854,618 B2 | 12/2023 | Penney |
| 11,984,148 B2 | 5/2024 | Penney et al. |
| 12,165,687 B2 | 12/2024 | He et al. |
| 12,217,813 B2 | 2/2025 | Pan |
| 12,236,996 B2 | 2/2025 | Lee et al. |
| 12,406,717 B2 | 9/2025 | Ayyapureddi et al. |
| 2001/0008498 A1 | 7/2001 | Ooishi |
| 2002/0007476 A1 | 1/2002 | Kishino |
| 2002/0078311 A1 | 6/2002 | Matsuzaki et al. |
| 2002/0080677 A1 | 6/2002 | Watanabe et al. |
| 2002/0181301 A1 | 12/2002 | Takahashi et al. |
| 2003/0063512 A1 | 4/2003 | Takahashi et al. |
| 2003/0067825 A1 | 4/2003 | Shimano et al. |
| 2003/0090400 A1 | 5/2003 | Barker |
| 2003/0095459 A1 | 5/2003 | Derner et al. |
| 2003/0123301 A1 | 7/2003 | Jang et al. |
| 2003/0193829 A1 | 10/2003 | Morgan et al. |
| 2003/0231540 A1 | 12/2003 | Lazar et al. |
| 2004/0004856 A1 | 1/2004 | Sakimura et al. |
| 2004/0008544 A1 | 1/2004 | Shinozaki et al. |
| 2004/0022093 A1 | 2/2004 | Lee |
| 2004/0052142 A1 | 3/2004 | Ikehashi et al. |
| 2004/0114446 A1 | 6/2004 | Takahashi et al. |
| 2004/0130959 A1 | 7/2004 | Kawaguchi |
| 2004/0174757 A1 | 9/2004 | Garverick et al. |
| 2004/0184323 A1 | 9/2004 | Mori et al. |
| 2004/0213035 A1 | 10/2004 | Cavaleri et al. |
| 2004/0218431 A1 | 11/2004 | Chung et al. |
| 2005/0041502 A1 | 2/2005 | Perner |
| 2005/0105315 A1 | 5/2005 | Shin et al. |
| 2005/0243629 A1 | 11/2005 | Lee |
| 2005/0265104 A1 | 12/2005 | Remaklus et al. |
| 2006/0039229 A1 | 2/2006 | Nakano |
| 2006/0059196 A1 | 3/2006 | Sato et al. |
| 2006/0083099 A1 | 4/2006 | Bae et al. |
| 2006/0087903 A1 | 4/2006 | Riho et al. |
| 2006/0119406 A1 | 6/2006 | Henzler et al. |
| 2006/0176744 A1 | 8/2006 | Stave |
| 2006/0262616 A1 | 11/2006 | Chen |
| 2007/0008799 A1 | 1/2007 | Dono et al. |
| 2007/0014174 A1 | 1/2007 | Ohsawa |
| 2007/0028068 A1 | 2/2007 | Golding et al. |
| 2007/0030746 A1 | 2/2007 | Best et al. |
| 2007/0033339 A1 | 2/2007 | Best et al. |
| 2007/0133330 A1 | 6/2007 | Ohsawa |
| 2007/0153611 A1 | 7/2007 | Lee |
| 2007/0230264 A1 | 10/2007 | Eto |
| 2007/0237016 A1 | 10/2007 | Miyamoto et al. |
| 2007/0297252 A1 | 12/2007 | Singh |
| 2008/0028260 A1 | 1/2008 | Oyagi et al. |
| 2008/0031068 A1 | 2/2008 | Yoo et al. |
| 2008/0062742 A1 | 3/2008 | Wang |
| 2008/0126893 A1 | 5/2008 | Harrand et al. |
| 2008/0130394 A1 | 6/2008 | Dono et al. |
| 2008/0181048 A1 | 7/2008 | Han |
| 2008/0224742 A1 | 9/2008 | Pomichter |
| 2008/0253212 A1 | 10/2008 | Iida et al. |
| 2008/0266990 A1 | 10/2008 | Loeffler |
| 2008/0288720 A1 | 11/2008 | Atwal et al. |
| 2008/0301362 A1 | 12/2008 | Cavanna et al. |
| 2008/0313494 A1 | 12/2008 | Hummler et al. |
| 2008/0316845 A1 | 12/2008 | Wang et al. |
| 2009/0021999 A1 | 1/2009 | Tanimura et al. |
| 2009/0059641 A1 | 3/2009 | Jeddeloh |
| 2009/0077571 A1 | 3/2009 | Gara et al. |
| 2009/0161457 A1 | 6/2009 | Wakimoto |
| 2009/0168571 A1 | 7/2009 | Pyo et al. |
| 2009/0185440 A1 | 7/2009 | Lee |
| 2009/0201752 A1 | 8/2009 | Riho et al. |
| 2009/0213675 A1 | 8/2009 | Shino |
| 2009/0251971 A1 | 10/2009 | Futatsuyama |
| 2009/0296510 A1 | 12/2009 | Lee et al. |
| 2010/0005217 A1 | 1/2010 | Jeddeloh |
| 2010/0005376 A1 | 1/2010 | Laberge et al. |
| 2010/0054011 A1 | 3/2010 | Kim |
| 2010/0074042 A1 | 3/2010 | Fukuda et al. |
| 2010/0080074 A1 | 4/2010 | Ohmaru et al. |
| 2010/0110809 A1 | 5/2010 | Kobayashi et al. |
| 2010/0110810 A1 | 5/2010 | Kobayashi |
| 2010/0131812 A1 | 5/2010 | Mohammad |
| 2010/0157693 A1 | 6/2010 | Iwai et al. |
| 2010/0182863 A1 | 7/2010 | Fukiage |
| 2010/0260003 A1 | 10/2010 | Oh |
| 2010/0329069 A1 | 12/2010 | Ito et al. |
| 2011/0026290 A1 | 2/2011 | Noda et al. |
| 2011/0051530 A1 | 3/2011 | Kushida |
| 2011/0055495 A1 | 3/2011 | Remaklus et al. |
| 2011/0069572 A1 | 3/2011 | Lee et al. |
| 2011/0122987 A1 | 5/2011 | Neyer |
| 2011/0216614 A1 | 9/2011 | Hosoe |
| 2011/0225355 A1 | 9/2011 | Kajigaya |
| 2011/0286271 A1 | 11/2011 | Chen |
| 2011/0310648 A1 | 12/2011 | Iwamoto et al. |
| 2011/0317462 A1 | 12/2011 | Gyllenhammer et al. |
| 2012/0014199 A1 | 1/2012 | Narui |
| 2012/0059984 A1 | 3/2012 | Kang et al. |
| 2012/0151131 A1 | 6/2012 | Kilmer et al. |
| 2012/0213021 A1 | 8/2012 | Riho et al. |
| 2012/0254472 A1 | 10/2012 | Ware et al. |
| 2013/0003467 A1 | 1/2013 | Klein |
| 2013/0003477 A1 | 1/2013 | Park et al. |
| 2013/0015578 A1 | 1/2013 | Thacker et al. |
| 2013/0057173 A1 | 3/2013 | Yao et al. |
| 2013/0107623 A1 | 5/2013 | Kavalipurapu et al. |
| 2013/0173971 A1 | 7/2013 | Zimmerman |
| 2013/0254475 A1 | 9/2013 | Perego et al. |
| 2013/0279284 A1 | 10/2013 | Jeong |
| 2013/0304982 A1 | 11/2013 | Jung et al. |
| 2014/0006703 A1 | 1/2014 | Bains et al. |
| 2014/0006704 A1 | 1/2014 | Greenfield et al. |
| 2014/0013169 A1 | 1/2014 | Kobla et al. |
| 2014/0013185 A1 | 1/2014 | Kobla et al. |
| 2014/0050004 A1 | 2/2014 | Mochida |
| 2014/0078841 A1 | 3/2014 | Chopra |
| 2014/0078842 A1 | 3/2014 | Oh et al. |
| 2014/0078845 A1 | 3/2014 | Song |
| 2014/0085995 A1 | 3/2014 | Greenfield et al. |
| 2014/0089576 A1 | 3/2014 | Bains et al. |
| 2014/0095780 A1 | 4/2014 | Bains et al. |
| 2014/0095786 A1 | 4/2014 | Moon et al. |
| 2014/0119091 A1 | 5/2014 | You et al. |
| 2014/0136763 A1 | 5/2014 | Li et al. |
| 2014/0143473 A1 | 5/2014 | Kim et al. |
| 2014/0156923 A1 | 6/2014 | Bains et al. |
| 2014/0177346 A1* | 6/2014 | Gupta ..................... G11C 8/10 365/189.04 |
| 2014/0177370 A1 | 6/2014 | Halbert et al. |
| 2014/0177376 A1 | 6/2014 | Song |
| 2014/0189215 A1 | 7/2014 | Kang et al. |
| 2014/0189228 A1 | 7/2014 | Greenfield et al. |
| 2014/0219043 A1 | 8/2014 | Jones et al. |
| 2014/0237307 A1 | 8/2014 | Kobla et al. |
| 2014/0241099 A1 | 8/2014 | Seo et al. |
| 2014/0254298 A1 | 9/2014 | Dally |
| 2014/0269009 A1 | 9/2014 | Ghosh et al. |
| 2014/0269021 A1 | 9/2014 | Yang et al. |
| 2014/0281206 A1 | 9/2014 | Crawford et al. |
| 2014/0281207 A1 | 9/2014 | Mandava et al. |
| 2014/0292375 A1 | 10/2014 | Angelini et al. |
| 2014/0293725 A1 | 10/2014 | Best et al. |
| 2014/0317344 A1 | 10/2014 | Kim |
| 2014/0355332 A1 | 12/2014 | Youn et al. |
| 2014/0369109 A1 | 12/2014 | Lee et al. |
| 2014/0379978 A1 | 12/2014 | Kim et al. |
| 2015/0049567 A1 | 2/2015 | Chi |
| 2015/0055420 A1 | 2/2015 | Bell et al. |
| 2015/0078112 A1 | 3/2015 | Huang |
| 2015/0089326 A1 | 3/2015 | Joo et al. |
| 2015/0155027 A1 | 6/2015 | Abe et al. |
| 2015/0162067 A1 | 6/2015 | Kim et al. |
| 2015/0170728 A1 | 6/2015 | Jung et al. |
| 2015/0199126 A1 | 7/2015 | Jayasena et al. |
| 2015/0206572 A1 | 7/2015 | Lim et al. |
| 2015/0213872 A1 | 7/2015 | Mazumder et al. |

(56)                References Cited

U.S. PATENT DOCUMENTS

| | | |
|---|---|---|
| 2015/0213877 A1 | 7/2015 | Darel |
| 2015/0228341 A1 | 8/2015 | Watanabe et al. |
| 2015/0243339 A1 | 8/2015 | Bell et al. |
| 2015/0255140 A1 | 9/2015 | Song |
| 2015/0262652 A1 | 9/2015 | Igarashi |
| 2015/0279441 A1 | 10/2015 | Greenberg et al. |
| 2015/0279442 A1 | 10/2015 | Hwang |
| 2015/0294711 A1 | 10/2015 | Gaither et al. |
| 2015/0340077 A1 | 11/2015 | Akamatsu |
| 2015/0356048 A1 | 12/2015 | King |
| 2015/0371699 A1* | 12/2015 | Lee ................... H03L 1/022 |
| | | 331/66 |
| 2016/0019940 A1 | 1/2016 | Jang et al. |
| 2016/0027498 A1 | 1/2016 | Ware et al. |
| 2016/0027531 A1 | 1/2016 | Jones et al. |
| 2016/0027532 A1 | 1/2016 | Kim |
| 2016/0042782 A1 | 2/2016 | Narui et al. |
| 2016/0071581 A1* | 3/2016 | Lee ................ G11C 11/5671 |
| | | 365/185.03 |
| 2016/0078845 A1 | 3/2016 | Lin et al. |
| 2016/0078911 A1 | 3/2016 | Fujiwara et al. |
| 2016/0078918 A1 | 3/2016 | Hyun et al. |
| 2016/0085466 A1 | 3/2016 | Benedict et al. |
| 2016/0086649 A1 | 3/2016 | Hong et al. |
| 2016/0086651 A1 | 3/2016 | Kim |
| 2016/0093402 A1 | 3/2016 | Kitagawa et al. |
| 2016/0099043 A1 | 4/2016 | Tu |
| 2016/0111140 A1 | 4/2016 | Joo et al. |
| 2016/0125931 A1 | 5/2016 | Doo et al. |
| 2016/0133314 A1 | 5/2016 | Hwang et al. |
| 2016/0140243 A1 | 5/2016 | Adams et al. |
| 2016/0163372 A1 | 6/2016 | Lee et al. |
| 2016/0172056 A1 | 6/2016 | Huh |
| 2016/0180917 A1 | 6/2016 | Chishti et al. |
| 2016/0180921 A1 | 6/2016 | Jeong |
| 2016/0196863 A1 | 7/2016 | Shin et al. |
| 2016/0202926 A1 | 7/2016 | Benedict |
| 2016/0211008 A1 | 7/2016 | Benedict et al. |
| 2016/0224262 A1 | 8/2016 | Mandava et al. |
| 2016/0225433 A1 | 8/2016 | Bains et al. |
| 2016/0225461 A1 | 8/2016 | Tuers et al. |
| 2016/0246525 A1 | 8/2016 | Jeffrey et al. |
| 2016/0336060 A1 | 11/2016 | Shin |
| 2016/0343423 A1 | 11/2016 | Shido |
| 2017/0011792 A1 | 1/2017 | Oh et al. |
| 2017/0076779 A1 | 3/2017 | Bains et al. |
| 2017/0092350 A1 | 3/2017 | Halbert et al. |
| 2017/0117030 A1 | 4/2017 | Fisch et al. |
| 2017/0133085 A1 | 5/2017 | Kim et al. |
| 2017/0139641 A1 | 5/2017 | Cha et al. |
| 2017/0140807 A1 | 5/2017 | Sun et al. |
| 2017/0140811 A1 | 5/2017 | Joo |
| 2017/0148504 A1 | 5/2017 | Saifuddin et al. |
| 2017/0177246 A1 | 6/2017 | Miller et al. |
| 2017/0186481 A1 | 6/2017 | Oh et al. |
| 2017/0213586 A1 | 7/2017 | Kang et al. |
| 2017/0221546 A1 | 8/2017 | Loh et al. |
| 2017/0263305 A1 | 9/2017 | Cho |
| 2017/0287547 A1 | 10/2017 | Ito et al. |
| 2017/0323675 A1 | 11/2017 | Jones et al. |
| 2017/0352399 A1 | 12/2017 | Yokoyama et al. |
| 2017/0371742 A1 | 12/2017 | Shim et al. |
| 2017/0372767 A1 | 12/2017 | Kang et al. |
| 2018/0004592 A1 | 1/2018 | Bains et al. |
| 2018/0005690 A1 | 1/2018 | Morgan et al. |
| 2018/0025770 A1 | 1/2018 | Ito et al. |
| 2018/0025772 A1 | 1/2018 | Lee et al. |
| 2018/0060194 A1 | 3/2018 | Ryu et al. |
| 2018/0061483 A1 | 3/2018 | Morgan |
| 2018/0082737 A1 | 3/2018 | Lee |
| 2018/0084314 A1 | 3/2018 | Koyama |
| 2018/0090199 A1 | 3/2018 | Kim et al. |
| 2018/0096719 A1 | 4/2018 | Tomishima et al. |
| 2018/0102776 A1 | 4/2018 | Chandrasekar et al. |
| 2018/0107417 A1 | 4/2018 | Shechter et al. |
| 2018/0114561 A1 | 4/2018 | Fisch et al. |
| 2018/0114565 A1 | 4/2018 | Lee |
| 2018/0158504 A1 | 6/2018 | Akamatsu |
| 2018/0158507 A1 | 6/2018 | Bang |
| 2018/0182445 A1 | 6/2018 | Lee et al. |
| 2018/0203621 A1 | 7/2018 | Ahn et al. |
| 2018/0218767 A1 | 8/2018 | Wolff |
| 2018/0261268 A1 | 9/2018 | Hyun et al. |
| 2018/0294028 A1 | 10/2018 | Lee et al. |
| 2018/0308539 A1 | 10/2018 | Ito et al. |
| 2018/0341553 A1 | 11/2018 | Koudele et al. |
| 2018/0342282 A1 | 11/2018 | Morgan |
| 2018/0366182 A1 | 12/2018 | Hyun et al. |
| 2019/0013059 A1 | 1/2019 | Akamatsu |
| 2019/0043558 A1 | 2/2019 | Suh et al. |
| 2019/0051344 A1 | 2/2019 | Bell et al. |
| 2019/0066759 A1 | 2/2019 | Nale |
| 2019/0066762 A1 | 2/2019 | Koya |
| 2019/0088315 A1 | 3/2019 | Saenz et al. |
| 2019/0088316 A1 | 3/2019 | Inuzuka et al. |
| 2019/0096492 A1 | 3/2019 | Cai et al. |
| 2019/0103147 A1 | 4/2019 | Jones et al. |
| 2019/0130961 A1 | 5/2019 | Bell et al. |
| 2019/0139599 A1 | 5/2019 | Ito et al. |
| 2019/0147941 A1 | 5/2019 | Qin et al. |
| 2019/0147964 A1 | 5/2019 | Yun et al. |
| 2019/0161341 A1 | 5/2019 | Howe |
| 2019/0172518 A1 | 6/2019 | Chen et al. |
| 2019/0172521 A1 | 6/2019 | Morgan |
| 2019/0187745 A1 | 6/2019 | Murali et al. |
| 2019/0196730 A1 | 6/2019 | Imran |
| 2019/0198078 A1 | 6/2019 | Hoang et al. |
| 2019/0198090 A1 | 6/2019 | Lee |
| 2019/0198099 A1 | 6/2019 | Mirichigni et al. |
| 2019/0205253 A1 | 7/2019 | Roberts |
| 2019/0207736 A1 | 7/2019 | Ben-tovim et al. |
| 2019/0228810 A1 | 7/2019 | Jones et al. |
| 2019/0228813 A1 | 7/2019 | Nale et al. |
| 2019/0228815 A1 | 7/2019 | Morohashi et al. |
| 2019/0237131 A1 | 8/2019 | Ito |
| 2019/0237132 A1 | 8/2019 | Morohashi |
| 2019/0243708 A1 | 8/2019 | Cha et al. |
| 2019/0252020 A1 | 8/2019 | Rios et al. |
| 2019/0267077 A1 | 8/2019 | Ito et al. |
| 2019/0279706 A1 | 9/2019 | Kim |
| 2019/0333573 A1 | 10/2019 | Shin et al. |
| 2019/0347019 A1 | 11/2019 | Shin et al. |
| 2019/0348100 A1 | 11/2019 | Smith et al. |
| 2019/0348102 A1 | 11/2019 | Smith et al. |
| 2019/0348103 A1 | 11/2019 | Jeong et al. |
| 2019/0348107 A1 | 11/2019 | Shin et al. |
| 2019/0349545 A1 | 11/2019 | Koh et al. |
| 2019/0362774 A1 | 11/2019 | Kuramori et al. |
| 2019/0371391 A1 | 12/2019 | Cha et al. |
| 2019/0385661 A1 | 12/2019 | Koo et al. |
| 2019/0385667 A1 | 12/2019 | Morohashi et al. |
| 2019/0386557 A1 | 12/2019 | Wang et al. |
| 2020/0005857 A1 | 1/2020 | Ito et al. |
| 2020/0075106 A1 | 3/2020 | Tokutomi et al. |
| 2020/0082873 A1 | 3/2020 | Wolff |
| 2020/0090760 A1 | 3/2020 | Purahmad et al. |
| 2020/0135263 A1 | 4/2020 | Brown et al. |
| 2020/0194050 A1 | 6/2020 | Akamatsu |
| 2020/0194056 A1 | 6/2020 | Sakurai et al. |
| 2020/0201380 A1 | 6/2020 | Murali et al. |
| 2020/0202921 A1 | 6/2020 | Morohashi et al. |
| 2020/0211626 A1 | 7/2020 | Hiscock et al. |
| 2020/0211633 A1 | 7/2020 | Okuma |
| 2020/0211636 A1 | 7/2020 | Hiscock et al. |
| 2020/0251158 A1 | 8/2020 | Shore et al. |
| 2020/0294576 A1 | 9/2020 | Brown et al. |
| 2020/0302994 A1 | 9/2020 | Enomoto et al. |
| 2020/0321049 A1 | 10/2020 | Meier et al. |
| 2020/0333451 A1 | 10/2020 | Wei et al. |
| 2020/0349995 A1 | 11/2020 | Shore et al. |
| 2020/0365208 A1 | 11/2020 | Schreck et al. |
| 2020/0381040 A1 | 12/2020 | Penney et al. |
| 2020/0395072 A1 | 12/2020 | Penney et al. |
| 2020/0411095 A1 | 12/2020 | Kim |

(56) References Cited

U.S. PATENT DOCUMENTS

| | | |
|---|---|---|
| 2021/0005229 A1 | 1/2021 | Hiscock et al. |
| 2021/0005240 A1 | 1/2021 | Brown et al. |
| 2021/0020223 A1 | 1/2021 | Ayyapureddi et al. |
| 2021/0020262 A1 | 1/2021 | Penney et al. |
| 2021/0026732 A1 | 1/2021 | Park et al. |
| 2021/0057012 A1 | 2/2021 | Ayyapureddi et al. |
| 2021/0057013 A1 | 2/2021 | Jenkinson et al. |
| 2021/0057021 A1 | 2/2021 | Wu et al. |
| 2021/0057022 A1 | 2/2021 | Jenkinson et al. |
| 2021/0065755 A1 | 3/2021 | Kim et al. |
| 2021/0065764 A1 | 3/2021 | Cheng et al. |
| 2021/0142852 A1 | 5/2021 | Schreck et al. |
| 2021/0158851 A1 | 5/2021 | Ayyapureddi et al. |
| 2021/0158860 A1 | 5/2021 | Wu et al. |
| 2021/0158861 A1 | 5/2021 | Jeong et al. |
| 2021/0201984 A1 | 7/2021 | Khasawneh et al. |
| 2021/0225432 A1 | 7/2021 | Enomoto et al. |
| 2021/0241810 A1 | 8/2021 | Hollis et al. |
| 2021/0265504 A1 | 8/2021 | Ishizu et al. |
| 2021/0343324 A1 | 11/2021 | Brown et al. |
| 2021/0350844 A1 | 11/2021 | Morohashi et al. |
| 2021/0398592 A1 | 12/2021 | Penney et al. |
| 2021/0407583 A1 | 12/2021 | Penney et al. |
| 2022/0051716 A1 | 2/2022 | Ayyapureddi |
| 2022/0068348 A1 | 3/2022 | Bennett et al. |
| 2022/0069992 A1 | 3/2022 | Ayyapureddi |
| 2022/0165347 A1 | 5/2022 | Pan |
| 2022/0230672 A1 | 7/2022 | Ayyapureddi et al. |
| 2022/0293166 A1 | 9/2022 | Ayyapureddi et al. |
| 2022/0415427 A1 | 12/2022 | Pan |
| 2023/0010619 A1 | 1/2023 | Ayyapureddi et al. |
| 2023/0047007 A1 | 2/2023 | Lovett |
| 2023/0096256 A1* | 3/2023 | Sasaki .................... H10B 12/50 |
| | | 257/213 |
| 2023/0170008 A1 | 6/2023 | Zhang et al. |
| 2023/0205428 A1 | 6/2023 | Kim et al. |
| 2023/0206980 A1 | 6/2023 | He et al. |
| 2023/0206989 A1 | 6/2023 | He et al. |
| 2024/0038292 A1 | 2/2024 | Kim et al. |
| 2024/0069757 A1 | 2/2024 | Ko et al. |
| 2024/0135980 A1 | 4/2024 | Lee et al. |
| 2024/0144988 A1 | 5/2024 | Seo et al. |
| 2025/0068345 A1 | 2/2025 | Lu et al. |
| 2025/0124963 A1 | 4/2025 | Lu |
| 2025/0124964 A1 | 4/2025 | Lu et al. |
| 2025/0131972 A1 | 4/2025 | Pan |
| 2026/0024571 A1 | 1/2026 | Ayyapureddi et al. |

FOREIGN PATENT DOCUMENTS

| | | |
|---|---|---|
| CN | 1371100 A | 9/2002 |
| CN | 101038785 A | 9/2007 |
| CN | 101067972 A | 11/2007 |
| CN | 101331554 A | 12/2008 |
| CN | 101346775 A | 1/2009 |
| CN | 101458658 A | 6/2009 |
| CN | 101595528 A | 12/2009 |
| CN | 101622607 A | 1/2010 |
| CN | 102074268 A | 5/2011 |
| CN | 102113058 A | 6/2011 |
| CN | 102364991 A | 2/2012 |
| CN | 102483952 A | 5/2012 |
| CN | 103366808 A | 10/2013 |
| CN | 103544987 A | 1/2014 |
| CN | 103928048 A | 7/2014 |
| CN | 104350546 A | 2/2015 |
| CN | 104462011 A | 3/2015 |
| CN | 105493188 A | 4/2016 |
| CN | 105814636 A | 7/2016 |
| CN | 106710621 A | 5/2017 |
| CN | 107256717 A | 10/2017 |
| CN | 107871516 A | 4/2018 |
| CN | 108122581 A | 6/2018 |
| CN | 108154895 A | 6/2018 |
| CN | 109074305 A | 12/2018 |
| CN | 109285576 A | 1/2019 |
| CN | 109408898 A | 3/2019 |
| CN | 110827884 A | 2/2020 |
| CN | 111247586 A | 6/2020 |
| CN | 112185443 A | 1/2021 |
| CN | 113330518 A | 8/2021 |
| CN | 113544779 A | 10/2021 |
| CN | 109074305 B | 7/2023 |
| EP | 2549482 A1 | 1/2013 |
| JP | H03164866 A | 7/1991 |
| JP | H0773682 A | 3/1995 |
| JP | H10241385 A | 9/1998 |
| JP | 2005-216429 A | 8/2005 |
| JP | 2011-258259 A | 12/2011 |
| JP | 4911510 B2 | 1/2012 |
| JP | 2012190506 A | 10/2012 |
| JP | 2013-004158 A | 1/2013 |
| KR | 20150002112 A | 1/2015 |
| KR | 20150002783 A | 1/2015 |
| KR | 20170058022 A | 5/2017 |
| KR | 20180064940 A | 6/2018 |
| KR | 1020180064940 A | 6/2018 |
| KR | 1020180085184 A | 7/2018 |
| KR | 20190048049 A | 5/2019 |
| WO | 2014120477 | 8/2014 |
| WO | 2015030991 A1 | 3/2015 |
| WO | 2017171927 A1 | 10/2017 |
| WO | 2018217582 A2 | 11/2018 |
| WO | 2019222960 A1 | 11/2019 |
| WO | 2020010010 A1 | 1/2020 |
| WO | 2020191222 A1 | 9/2020 |
| WO | 2021003085 A1 | 1/2021 |
| WO | 2022108808 A1 | 5/2022 |

OTHER PUBLICATIONS

Kim et al. "Flipping Bits in Memory Without Accessing Them: An Experimental Study of DRAM Disturbance Errors", IEEE, Jun. 2014, pp. all.*

Stout, Thomas et al. "Voltage Source Based Voltage-to-Time Converter", IEEE, downloaded Jul. 2020 , pp. all.*

U.S. Appl. No. 19/292,661 titled "Apparatuses and Methods for Dynamically Allocated Aggressor Detection" filed Aug. 6, 2025, pp. all pages of the application as filed.

U.S. Appl. No. 18/741,485 titled "Apparatuses and Methods for Aggressor Queue Based Mitigation Threshold" filed Jun. 12, 2024, pp. all pages of the application as filed.

U.S. Appl. No. 18/743,783 titled "Apparatuses and Methods for Per-Row Count Based Refresh Target Identification" filed Jun. 14, 2024, pp. all pages of the application as filed.

U.S. Appl. No. 18/744,988 titled "Apparatuses and Methods for Per-Row Count Based Refresh Target Identification With Sorting" filed Jun. 17, 2024, pp. all pages of the application as filed.

U.S. Appl. No. 18/745,068 titled "Apparatuses and Methods for Per Row Activation Counter Testing" filed Jun. 17, 2024, pp. all pages of the application as filed.

U.S. Appl. No. 15/884,192 titled 'Semiconductor Device Performing Row Hammer Refresh Operation' filed on Jan. 30, 2018, pp. all pages of application as filed.

U.S. Appl. No. 16/797,658, titles "Apparatuses and Methods for Controlling Refresh Operations", filed Feb. 21, 2020, pp. all pages of application as filed.

U.S. Appl. No. 16/818,981 titled "Apparatuses and Methods for Staggered Timing of Targeted Refresh Operations" filed Mar. 13, 2020, pp. all pages of application as filed.

U.S. Appl. No. 16/824,460, titled "Semiconductor Device Performing Row Hammer Refresh Operation", dated Mar. 19, 2020, pp. all pages of application as filed.

U.S. Appl. No. 16/025,844, titled "Apparatus and Methods for Triggering Row Hammer Address Sampling", filed Jul. 2, 2018, pp. all pages of application as filed.

U.S. Appl. No. 16/783,063, titled "Apparatus and Methods for Triggering Row Hammer Address Sampling", dated Feb. 5, 2020 , pp. all pages of application as filed.

(56) References Cited

OTHER PUBLICATIONS

U.S. Appl. No. 16/805,197, titled "Apparatuses and Methods for Calculating Row Hammer Refresh Addresses in a Semiconductor Device", dated Feb. 28, 2020, pp. all pages of application as filed.

U.S. Appl. No. 16/232,837, titled "Apparatuses and Methods for Distributed Targeted Refresh Operations", filed Dec. 26, 2018, pp. all pages of application as filed.

U.S. Appl. No. 16/818,989, titled "Semiconductor Device Performing Row Hammer Refresh Operation", dated Mar. 13, 2020, pp. all pages of application as filed.

U.S. Appl. No. 16/268,818, titled "Apparatuses and Methods for Managing Row Access Counts", filed Feb. 6, 2019, pp. all pages of application as filed.

U.S. Appl. No. 16/286,187 titled "Apparatuses and Methods for Memory Mat Refresh Sequencing" filed on Feb. 26, 2019, pp. all pages of application as filed.

U.S. Appl. No. 16/084,119, titled "Apparatuses and Methods for Pure-Time, Self Adopt Sampling for Row Hammer Refresh Sampling", filed Sep. 11, 2018, pp. all pages of application as filed.

U.S. Appl. No. 16/886,284 titled "Apparatuses and Methods for Access Based Refresh Timing" filed May 28, 2020, pp. all pages of application as filed.

U.S. Appl. No. 16/886,284, titled "Apparatuses and Methods for Access Based Refresh Timing", dated May 28, 2020, pp. all pages of application as filed.

U.S. Appl. No. 16/358,587, titled "Semiconductor Device Having Cam That Stores Address Signals", dated Mar. 19, 2019, pp. all pages of application as filed.

U.S. Appl. No. 16/375,716 titled "Apparatuses and Methods for Staggered Timing of Targeted Refresh Operations" filed on Apr. 4, 2019, pp. all pages of application as filed.

U.S. Appl. No. 16/411,573 titled "Apparatuses, Systems, and Methods for a Content Addressable Memory Cell" filed May 14, 2019, pp. all pages of application as filed.

U.S. Appl. No. 16/428,625 titled "Apparatuses and Methods for Tracking Victim Rows" filed May 31, 2019, pp. all pages of application as filed.

U.S. Appl. No. 16/513,400 titled "Apparatuses and Methods for Tracking Row Accesses" filed Jul. 16, 2019, pp. all pages of application as filed.

U.S. Appl. No. 17/060,403 titled "Apparatuses and Methods for Adjusting Victim Data" filed Oct. 1, 2020, pp. all pages of application as filed.

U.S. Appl. No. 16/548,027 titled "Apparatuses, Systems, and Methods for Analog Row Access Rate Determination" filed Aug. 22, 2019, pp. all pages of application as filed.

U.S. Appl. No. 16/549,942 titled "Apparatuses and Methods for Lossy Row Access Counting" filed Aug. 23, 2019, pp. all pages of application as filed.

U.S. Appl. No. 16/546,152 titled "Apparatuses and Methods for Analog Row Access Tracking" filed Aug. 20, 2019, pp. all pages of application as filed.

U.S. Appl. No. 16/549,411 titled "Apparatuses and Methods for Dynamic Refresh Allocation" filed Aug. 23, 2019, pp. all pages of application as filed.

U.S. Appl. No. 16/655,110 titled "Apparatuses and Methods for Dynamic Targeted Refresh Steals" filed Oct. 16, 2019, pp. all pages of application as filed.

U.S. Appl. No. 17/154,945 titled "Apparatuses, Systems, and Methods for a Content Addressable Memory Cell" filed Jan. 21, 2021, pp. all pages of application as filed.

U.S. Appl. No. 17/170,616 titled "Apparatuses, Systems, and Methods for Analog Row Access Rate Determination" filed Feb. 8, 2021, pp. all pages of application as filed.

U.S. Appl. No. 17/168,036 titled "Apparatuses and Methods for Analog Row Access Tracking" filed Feb. 4, 2021, pp. all pages of application as filed.

U.S. Appl. No. 17/301,533 titled "Semiconductor Device Having Cam That Stores Address Signals" filed Apr. 6, 2021, pp. all pages of application as filed.

U.S. Appl. No. 17/443,056 titled "Apparatuses and Methods for Multiple Row Hammer Refresh Address Sequences" filed Jul. 20, 2021, pp. all pages of application as filed.

U.S. Appl. No. 17/446,710 titled "Apparatuses, Systems, and Methods for Determining Extremum Numerical Values" filed Sep. 1, 2021, pp. all pages of application as filed.

U.S. Appl. No. 17/470,883 titled "Apparatuses and Methods for Tracking Victim Rows" filed Sep. 9, 2021, pp. all pages of application as filed.

U.S. Appl. No. 17/153,555 titled "Apparatuses and Methods for Dynamically Allocated Aggressor Detection" filed Jan. 20, 2021, pp. all pages of application as filed.

U.S. Appl. No. 17/201,941 titled "Apparatuses and Methods for Sketch Circuits for Refresh Binning" filed Mar. 15, 2021, pp. all pages of application as filed.

U.S. Appl. No. 17/375,817 titled "Apparatuses and Methods for Monitoring Word Line Accesses" filed Jul. 14, 2021, pp. all pages of application as filed.

U.S. Appl. No. 16/788,657, titled "Semiconductor Device Performing Row Hammer Refresh Operation", dated Feb. 12, 2020, pp. all pages of application as filed.

U.S. Appl. No. 17/932,206, titled, "Apparatuses and Methods for Dynamically Allocated Aggressor Detection" filed Sep. 14, 2022; pp. all pages of application as filed.

U.S. Appl. No. 15/881,256 entitled 'Apparatuses and Methods for Detecting a Row Hammer Attack With a Bandpass Filter' filed on Jan. 26, 2018, pp. all pages of application as filed.

U.S. Appl. No. 16/425,525 titled "Apparatuses and Methods for Tracking All Row Accesses" filed May 29, 2019, pp. all pages of application as filed.

U.S. Appl. No. 16/427,105 titled "Apparatuses and Methods for Priority Targeted Refresh Operations" filed May 30, 2019, pp. all pages of application as filed.

U.S. Appl. No. 16/427,140 titled "Apparatuses and Methods for Tracking Row Access Counts Between Multiple Register Stacks" filed May 30, 2019, pp. all pages of application as filed.

U.S. Appl. No. 16/437,811 titled "Apparatuses, Systems, and Methods for Determining Extremum Numerical Values" filed Jun. 11, 2019, pp. all pages of application as filed.

U.S. Appl. No. 16/537,981 titled "Apparatuses and Methods for Controlling Targeted Refresh Rates" filed Aug. 12, 2019, pp. all pages of application as filed.

U.S. Appl. No. 17/007,069 titled "Apparatuses and Methods for Providing Refresh Addresses" filed Aug. 31, 2020, pp. all pages of application as filed.

U.S. Appl. No. 17/444,925 titled "Apparatuses and Methods for Countering Memory Attacks" filed Aug. 12, 2021, pp. all pages of application as filed.

U.S. Appl. No. 17/456,849 titled "Apparatuses, Systems, and Methods for Main Sketch and Slim Sketch Circuit for Row Address Tracking" filed Nov. 29, 2021, pp. all pages of application as filed.

U.S. Appl. No. 17/565,119 titled "Apparatuses and Methods for Row Hammer Counter Mat" filed Dec. 29, 2021, pp. all pages of application as filed.

U.S. Appl. No. 17/565,187 titled "Apparatuses and Methods for Row Hammer Counter Mat" filed Dec. 29, 2021, pp. all pages of application as filed.

U.S. Appl. No. 15/789,897, entitled "Apparatus and Methods for Refreshing Memory", filed Oct. 20, 2017, pp. all pages of application as filed.

U.S. Appl. No. 15/796,340, entitled: "Apparatus and Methods for Refreshing Memory" filed on Oct. 27, 2017, pp. all pages of application as filed.

U.S. Appl. No. 16/012,679, titled "Apparatuses and Methods for Multiple Row Hammer Refresh Address Sequences", filed Jun. 19, 2018, pp. all pages of application as filed.

U.S. Appl. No. 16/020,863, titled "Semiconductor Device", filed Jun. 27, 2018, pp. all pages of application as filed.

U.S. Appl. No. 16/112,471 titled "Apparatuses and Methods for Controlling Refresh Operations" filed Aug. 24, 2018, pp. all pages of application as filed.

(56)     References Cited

OTHER PUBLICATIONS

U.S. Appl. No. 16/160,801, titled "Apparatuses and Methods for Selective Row Refreshes" filed on Oct. 15, 2018, pp. all pages of application as filed.
U.S. Appl. No. 16/176,932, titled "Apparatuses and Methods for Access Based Refresh Timing", filed Oct. 31, 2018, pp. all pages of application as filed.
U.S. Appl. No. 16/208,217, titled "Semiconductor Device Performing Row Hammer Refresh Operation", filed Dec. 3, 2018, pp. all pages of application as filed.
U.S. Appl. No. 16/230,300, titled "Apparatuses and Methods for Staggered Timing of Targeted Refresh Operations" filed Dec. 21, 2018, pp. all pages of application as filed.
U.S. Appl. No. 16/231,327 titled "Apparatuses and Methods for Selective Row Refreshes", filed on Dec. 21, 2018, pp. all pages of application as filed.
U.S. Appl. No. 16/237,291, titled "Apparatus and Methods for Refreshing Memory", filed Dec. 31, 2018, pp. all pages of application as filed.
U.S. Appl. No. 16/290,730, titled "Semiconductor Device Performing Row Hammer Refresh Operation", filed Mar. 1, 2019, pp. all pages of application as filed.
U.S. Appl. No. 16/374,623, titled "Semiconductor Device Performing Row Hammer Refresh Operation", filed Apr. 3, 2019, pp. all pages of application as filed.
U.S. Appl. No. 16/411,698 title "Semiconductor Device" filed May 14, 2019, pp. all pages of application as filed.
U.S. Appl. No. 16/427,330 titled "Apparatuses and Methods for Storing Victim Row Data" filed May 30, 2019, pp. all pages of application as filed.
U.S. Appl. No. 16/431,641 titled "Apparatuses and Methods for Controlling Steal Rates" filed Jun. 4, 2019, pp. all pages of application as filed.
U.S. Appl. No. 16/682,606, titled "Apparatuses and Methods for Distributing Row Hammer Refresh Events Across a Memory Device", filed Nov. 13 2019, pp. all pages of application as filed.
U.S. Appl. No. 17/102,266, titled "Apparatuses and Methods for Tracking Word Line Accesses", dated Nov. 23, 2020, pp. all pages of application as filed.
U.S. Appl. No. 15/876,566 entitled 'Apparatuses and Methods for Calculating Row Hammer Refresh Addresses in a Semiconductor Device' filed on Jan. 22, 2018, pp. all pages of application as filed.
U.S. Appl. No. 15/656,084, titled "Apparatuses and Methods for Targeted Refreshing of Memory" filed Jul. 21, 2017, , pp. all pages of application as filed.
U.S. Appl. No. 16/459,520 titled "Apparatuses and Methods for Monitoring Word Line Accesses", filed Jul. 1, 2019, pp. all pages of application as filed.
U.S. Appl. No. 15/715,846, entitled "Semiconductor Device", filed Sep. 26, 2017, pp. all pages of application as filed.
U.S. Appl. No. 15/888,993, entitled "Apparatuses and Methods for Controlling Refresh Operations", filed Feb. 5, 2018, pp. all pages of application as filed.
U.S. Appl. No. 16/190,627 titled "Apparatuses and Methods for Targeted Refreshing of Memory" filed Nov. 14, 2018, pp. all pages of application as filed.
U.S. Appl. No. 16/459,507 titled "Apparatuses and Methods for Adjusting Victim Data", filed Jul. 1, 2019, pp. all pages of application as filed.
U.S. Appl. No. 15/281,818, entitled: "Semiconductor Device" filed on Sep. 30, 2016, pp. all pages of application as filed.
Zheng, Bin , et al. "Design of Built-in DRAM for TFT-LCD Driver Chip LCD and display," Issue 4, Aug. 15, 2009, pp. all.

* cited by examiner

800

810
Reading a Count Value from Memory Cells along a Word Line

820
Inverting the Count Value

830
Increasing the Inverted Count Value

840
Inverting the Increased Inverted Count Value to Generate an Updated Count Value 850
Writing the Updated Count Value Back to the Memory Cells 860
Determining If the Word Line is an Aggressor Row Based on the Updated Count Value

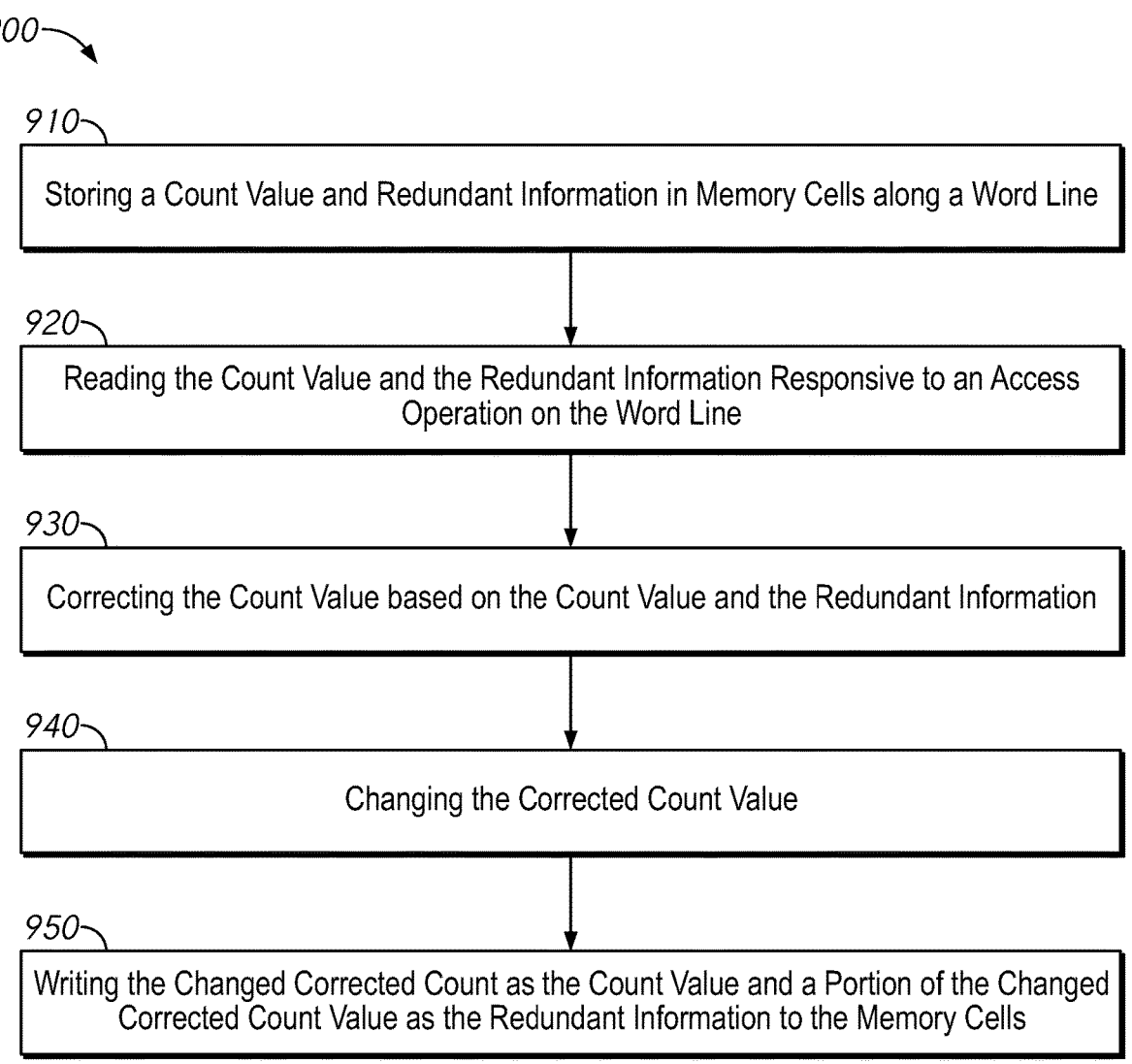

900

910

Storing a Count Value and Redundant Information in Memory Cells along a Word Line

920

Reading the Count Value and the Redundant Information Responsive to an Access Operation on the Word Line

930

Correcting the Count Value based on the Count Value and the Redundant Information

940

Changing the Corrected Count Value

950

Writing the Changed Corrected Count as the Count Value and a Portion of the Changed Corrected Count Value as the Redundant Information to the Memory Cells

FIG. 9

APPARATUSES AND METHODS FOR INCREASED RELIABILITY ROW HAMMER COUNTS

CROSS REFERENCE TO RELATED APPLICATION(S)

This application claims the benefit under 35 U.S.C. § 119 of the earlier filing date of U.S. Provisional Application Ser. No. 63/476,732 filed Dec. 22, 2022 the entire contents of which are hereby incorporated by reference in their entirety for any purpose.

BACKGROUND

Information may be stored on memory cells of a memory device. The memory cells may be organized at the intersection of word lines (rows) and bit lines (columns). Information in the memory cells may decay over time. For example, the information may be stored as a charge on a capacitor which may decay over time. The memory device may perform refresh operations to restore the information and prevent information from being lost.

Certain patterns of access may cause an increased rate of information decay in nearby memory cells (e.g., the memory cells along nearby word lines). Memory devices may use various schemes to identify these access patterns so that additional targeted refresh operations may be performed. It may be important to ensure that the scheme which tracks access patterns is not prone to errors to prevent information from being lost.

BRIEF DESCRIPTION OF THE DRAWINGS

FIG. 9 is a flow chart of a method of correcting count values according to some embodiments of the present disclosure.

DETAILED DESCRIPTION

Figure 1:
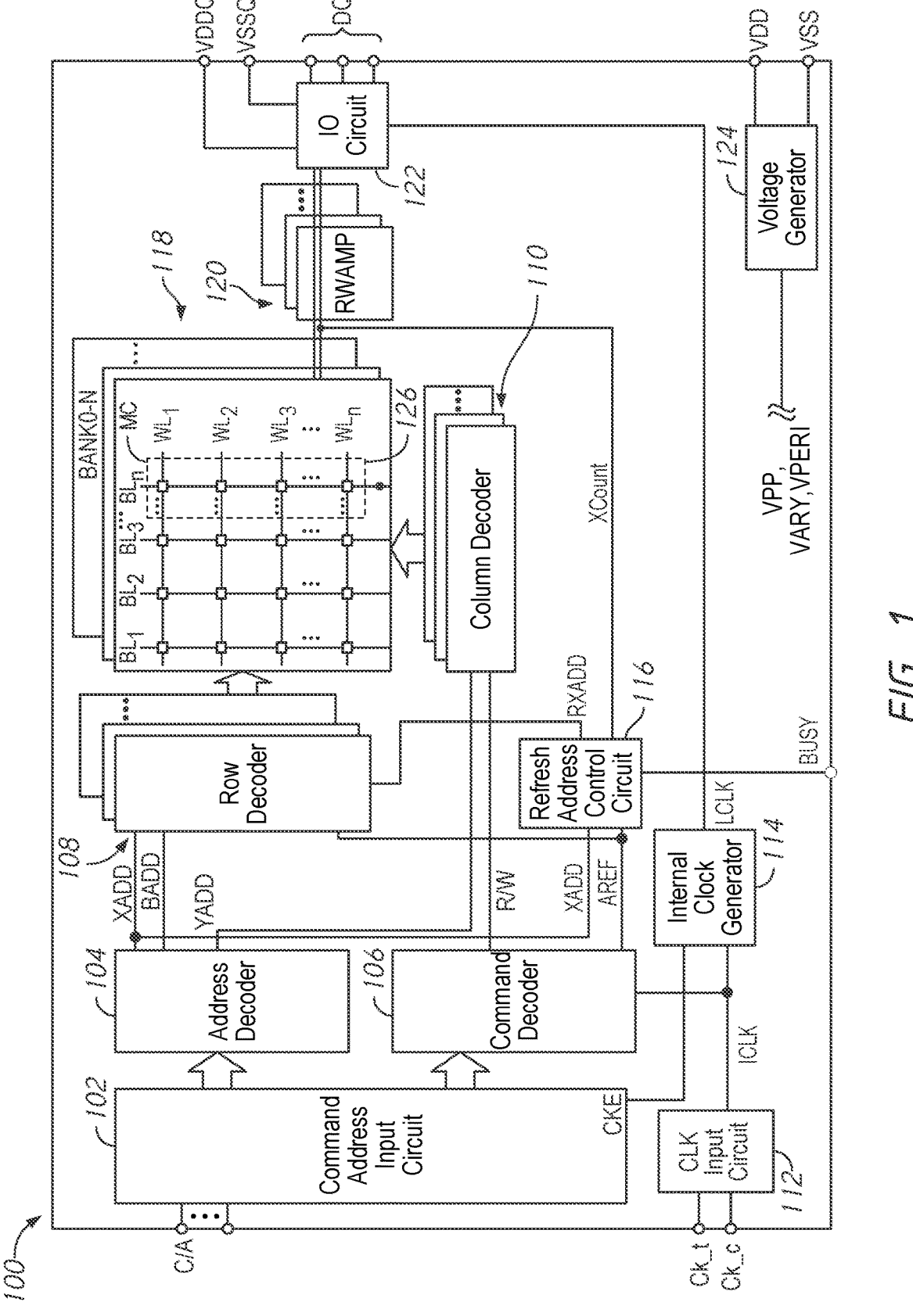
FIG. 1 is a block diagram of a semiconductor device according to an embodiment of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Information in a memory array may be accessed by one or more access operations, such as read or write operations. During an example access operation a word line may be activated based on a row address and then selected memory cells along that active word line may have their information read or written to based on which bit lines are accessed, which may be based on a column address. The memory array may be refreshed on a row by row basis (e.g., as part of an auto-refresh and/or self-refresh mode) where the memory cells along each row are refreshed periodically. The speed at which the rows are refreshed (e.g., the maximum time any given row will go between refreshes) may be determined based on an expected rate of information decay.

Various patterns of access to a row (an aggressor row) may cause an increased rate of information decay in nearby memory cells (e.g., along victim rows). For example, a 'row hammer' may involve repeated accesses to the aggressor row. Accordingly, it may be important to track a number of accesses to each row to determine if they are aggressors, such that the victim rows can be identified and refreshed as part of a targeted refresh operation. For example, each word line may have an associated count value which is used to determine how many times that word line has been accessed. The count values may be saved in memory cells along each word line. While this may allow for easy storage of count values for each word line, data stored in memory cells may be prone to error, for example due to neutron strikes. There may be a need to ensure the reliability of these count values.

The present disclosure is drawn to apparatuses, systems, and methods for increased reliability row hammer counts. A memory device includes a number of word lines, each of which stores data as well as a count value which represents a number of times that word line has been accessed. When the word line is accessed, the count value is read out to a counter circuit, which changes the count value, compares the count value to a threshold, and then writes the changed count value back. If the count value has crossed the threshold, then the word line may be identified as an aggressor row and the count value is reset.

In some embodiments, the counter circuit may decrement or otherwise decrease the count value responsive to each access. Failures in memory cells, such as those caused by neutron strikes, may change logical high to logical low values much more frequently than logical low to logical high values. When the count value is decreased, if there is an error, the error will tend to artificially move the count closer to the threshold (e.g., tend to overestimate the number of accesses) which is less dangerous than a situation where the count value increases, where errors would tend to move the count away from the threshold.

In some embodiments, the memory may include a count error correction circuit which may check the count value for errors and determine if the count value requires correction. For example, a portion of the count value (e.g., some set of the most significant bits) may be repeated and saved multiple times in the memory array. For example, if the full count value is Count<M:0> then the memory array may store Count<M:N>, Count<M:N> and Count<M:0>. The count error correction circuit may be a voting circuit which checks the three sets of Count<M:N> and sets a value of all three based on a majority vote of the three sets. This may add error correction to preserve information in the count values. In some embodiments both a decreasing count value and a count error correction circuit may be used together.

FIG. 1 is a block diagram of a semiconductor device according to at least one embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. Each memory bank includes a plurality of word lines WL (rows), a plurality of bit lines BL (columns), and a plurality of memory cells MC arranged at intersections of the plurality of word lines WL and the plurality of bit lines BL.

The selection of the word line WL is performed by a row decoder 108 and the selection of the bit lines BL is performed by a column decoder 110. In the embodiment of FIG. 1, the row decoder 108 includes a respective row decoder for each memory bank and the column decoder 110 includes a respective column decoder for each memory bank. The bit lines BL are coupled to a respective sense amplifier (SAMP). Read data from the bit line BL is amplified by the sense amplifier SAMP, and transferred to read/write amplifiers 120 over complementary local data lines (LIOT/B), transfer gate (TG), and complementary main data lines (MIOT/B). Conversely, write data outputted from the read/write amplifiers 120 is transferred to the sense amplifier SAMP over the complementary main data lines MIOT/B, the transfer gate TG, and the complementary local data lines LIOT/B, and written in the memory cell MC coupled to the bit line BL.

Some of the memory cells may be set aside as counter memory cells 126. The counter memory cells may store count values XCount, each of which is associated with one of the word lines. Each count value XCount may be stored in counter memory cells 126 along the word line that the count value is associated with. The count value XCount may be stored as a binary number, with each bit stored in a memory cell along the word line. In some embodiments, the counter memory cells 126 may be generally similar to the other memory cells of the array 118. In some embodiments, the counter memory cells 126 may be grouped together (e.g., at the end of the word line). Other distributions of the counter memory cells 126 along the word line may be used in other example embodiments. In some embodiments, the counter memory cells 126 may not be directly accessible by external devices such as controllers (e.g., to prevent the count values from being overwritten). In other words, the bit lines associated with the counter memory cells 126 may not be accessed by a normal column address. As described in more detail herein, in some embodiments the counter memory cells 126 may store redundant information along with the count value to help enable error correction of the count value.

The semiconductor device 100 may employ a plurality of external terminals that include command and address (C/A) terminals coupled to a command and address bus to receive commands and addresses, and a CS signal, clock terminals to receive clocks CK and /CK, data terminals DQ to provide data, and power supply terminals to receive power supply potentials VDD, VSS, VDDQ, and VSSQ.

The clock terminals are supplied with external clocks CK and/CK that are provided to an input circuit 112. The external clocks may be complementary. The input circuit 112 generates an internal clock ICLK based on the CK and/CK clocks. The ICLK clock is provided to the command decoder 110 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122. for example, to data receivers to time the receipt of write data.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The device 100 may receive an access command which is a row activation command ACT. When the row activation command ACT is received, a bank address BADD and a row address XADD are timely supplied with the row activation command ACT.

The device 100 may receive an access command which is a read command. When a read command is received, a bank address BADD and a column address YADD are timely supplied with the read command, read data is read from memory cells in the memory array 118 corresponding to the row address XADD and column address YADD. The read command is received by the command decoder 106, which provides internal commands so that read data from the memory array 118 is provided to the read/write amplifiers 120. The read data is output to outside from the data terminals DQ via the input/output circuit 122. The access count XCount stored counter memory cells 126 of the row associated with the row address XADD are read to the refresh address control circuit 116, and an updated value of the access count XCount' is written back to the counter memory cells 126 of the row XADD. In some embodiments, redundant count information may also be read out and used to correct the count such that the updated access count XCount' is corrected as well.

The device 100 may receive an access command which is a write command. When the write command is received, a bank address BADD and a column address YADD are timely supplied with the write command, write data supplied to the data terminals DQ is written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 to the read/write amplifiers 120, and by the read/write amplifiers 120 to the memory array 118 to be written into the memory cell MC. Similar to the read operation described above, the access count Xcount stored in counter memory cells 126 of the row associated with the row address XADD are read to the refresh address control circuit 116, and an updated value of the access count Xcount' is written back to the counter memory cells 126 of the row XADD. Similar to described above, in some embodiments, error correction may also be performed.

The device 100 may also receive commands causing it to carry out refresh operations. For example, a controller of the memory may put the device 100 into an auto-refresh mode and provide an auto-refresh signal AREF. The device 100 may also enter a self-refresh mode where the refresh signal is generated internally. Since other than the source of the refresh signal the two operations may generally be signal, the present disclosure will generally describe auto-refresh operations. However, it should be understood that the present disclosure may apply to self-refresh (or other refresh modes) as well.

The refresh signal AREF may be a pulse signal which is activated when the command decoder 106 receives a signal which indicates an auto-refresh command. In some embodiments, the auto-refresh command may be externally issued to the memory device 100. In some embodiments, the auto-refresh command may be periodically generated by a component of the device (e.g., as part of a self-refresh mode). In some embodiments, when an external signal indicates a self-refresh entry command, the refresh signal AREF may also be activated. The refresh signal AREF may be activated once immediately after command input, and thereafter may be cyclically activated at desired internal timing. Thus, refresh operations may continue automatically. A self-refresh exit command may cause the automatic activation of the refresh signal AREF to stop and return to an IDLE state.

The refresh signal AREF is supplied to the refresh address control circuit 116. The refresh address control circuit 116 supplies a refresh row address RXADD to the row decoder 108, which may refresh a wordline WL indicated by the refresh row address RXADD. The refresh address control circuit 116 may control a timing of the refresh operation, and may generate and provide the refresh address RXADD. The refresh address control circuit 116 may be controlled to change details of the refreshing address RXADD (e.g., how the refresh address is calculated, the timing of the refresh addresses), or may operate based on internal logic.

The refresh address control circuit 116 may selectively output a targeted refresh address (e.g., a victim address) or an automatic refresh address (auto-refresh address) as the refreshing address RXADD. The automatic refresh addresses may be a sequence of addresses which are provided based on activations of the auto-refresh signal AREF. The refresh address control circuit 116 may cycle through the sequence of auto-refresh addresses at a rate determined by AREF. In some embodiments, the sequence of auto-refresh addresses may include all the addresses in the memory bank 118. In some embodiments, the auto-refresh signal AREF may be issued with a frequency such that most or all of the addresses in the memory bank 118 are refreshed within a certain period (e.g., such that there is a maximum specified time between two consecutive auto-refreshes of a given word line), which may be based on an expected rate at which information in the memory cells MC decays.

The refresh address control circuit 116 may also determine targeted refresh addresses which are addresses that require refreshing (e.g., victim addresses corresponding to victim rows) based on the access pattern of nearby addresses (e.g., aggressor addresses associated with aggressor rows) in the memory array 118. The refresh address control circuit 116 may monitor accesses to the different wordlines WL of the memory bank. When the row decoder 108 sends an access command to a particular row, the counter memory cells 126 along that row may have their information read to the refresh address control circuit 116 as the access count Xcount (along with any redundant information for error correction). The refresh address control circuit 116 may determine an access count of the row based on the values of the bits of the access count XCount.

The refresh address control circuit 116 may update the count value and determine if the accessed row is an aggressor row based on the updated count value XCount'. For example, the updated count value XCount' may be compared to a threshold. If the updated count value XCount' crosses the threshold (or meets/crosses the threshold) then the current row address may be judged to be an aggressor. If the current row is not an aggressor row, then the updated count value XCount' may be written back to the counter memory cells 126 of the accessed word line. In some embodiments, the refresh address control circuit 116 may update the count value by decreasing the count value XCount. For example, with each access, the value of XCount may be decremented.

If the refresh address control circuit 116 determines that the accessed row is an aggressor, then the refresh address control circuit 116 may identify the row address XADD of the current word line as an aggressor. The identified aggressor address may be used to determine one or more victim row addresses and provide them as a refresh address RXADD as part of a targeted refresh operation. For example the identified aggressor address may be added to an aggressor address queue. When the accessed row is determined to be an aggressor, the access count XCount associated with that row may be reset (e.g., to an initial value). In embodiments where XCount is decreased with each access, the value XCount may be reset to a maximum value (e.g., where each bit of XCount is a logical high).

In embodiments where error correction is used, the count value XCount may be read out along with one or more pieces of redundant information. The refresh address control circuit 116 may include a count error correction circuit. Based on the redundant information, the count value XCount may be corrected when it is read out to the refresh address control circuit 116. For example, the refresh control circuit 116 may locate and correct errors in all or part of the count value XCount before updating the count value and determining if the updated count value has crossed the threshold. The updated count value along with updated redundant information may be written back to the counter memory cells 126.

The refresh address RXADD may be provided with a timing based on a timing of the refresh signal AREF. The refresh address control circuit 116 may have time slots corresponding to the timing of AREF, and may provide one or more refresh addresses RXADD during each time slot. In some embodiments, the targeted refresh address may be issued in (e.g., "steal") a time slot which would otherwise have been assigned to an auto-refresh address. In some embodiments. certain time slots may be reserved for targeted refresh addresses, and the refresh address control circuit 116 may determine whether to provide a targeted refresh address, not provide an address during that time slot, or provide an auto-refresh address instead during the time slot.

The targeted refresh address may be based on access characteristics over time of the row addresses XADD received from the address decoder 104. For example, the access characteristics may be determined based on the value of the access count Xcount stored in the counter memory cells 126. The refresh address control circuit 116 may use different methods to calculate a targeted refresh address based on a row address XADD identified as an aggressor address based on the access count. For example, the refresh address control circuit 116 may determine if a given row is an aggressor address, and then calculate and provide addresses corresponding to victim addresses of the aggressor address as the targeted refresh address. In some embodiments, more than one victim address may correspond to a given aggressor address. In this case the refresh address control circuit may queue up multiple targeted refresh addresses, and provide them sequentially when it determines that a targeted refresh address should be provided. The refresh address control circuit 116 may provide the targeted refresh address right away, or may queue up the targeted refresh address to be provided at a later time (e.g., in the next time slot available for a targeted refresh).

The power supply terminals are supplied with power supply potentials VDD and VSS. The power supply potentials VDD and VSS are supplied to an internal voltage generator circuit 124. The internal voltage generator circuit 124 generates various internal potentials VPP, VARY, VPERI, and the like based on the power supply potentials VDD and VSS supplied to the power supply terminals. The internal potential VPP is mainly used in the row decoder 108, the internal potentials VARY are mainly used in the sense amplifiers SAMP included in the memory array 118. and the internal potential VPERI is used in many peripheral circuit blocks.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
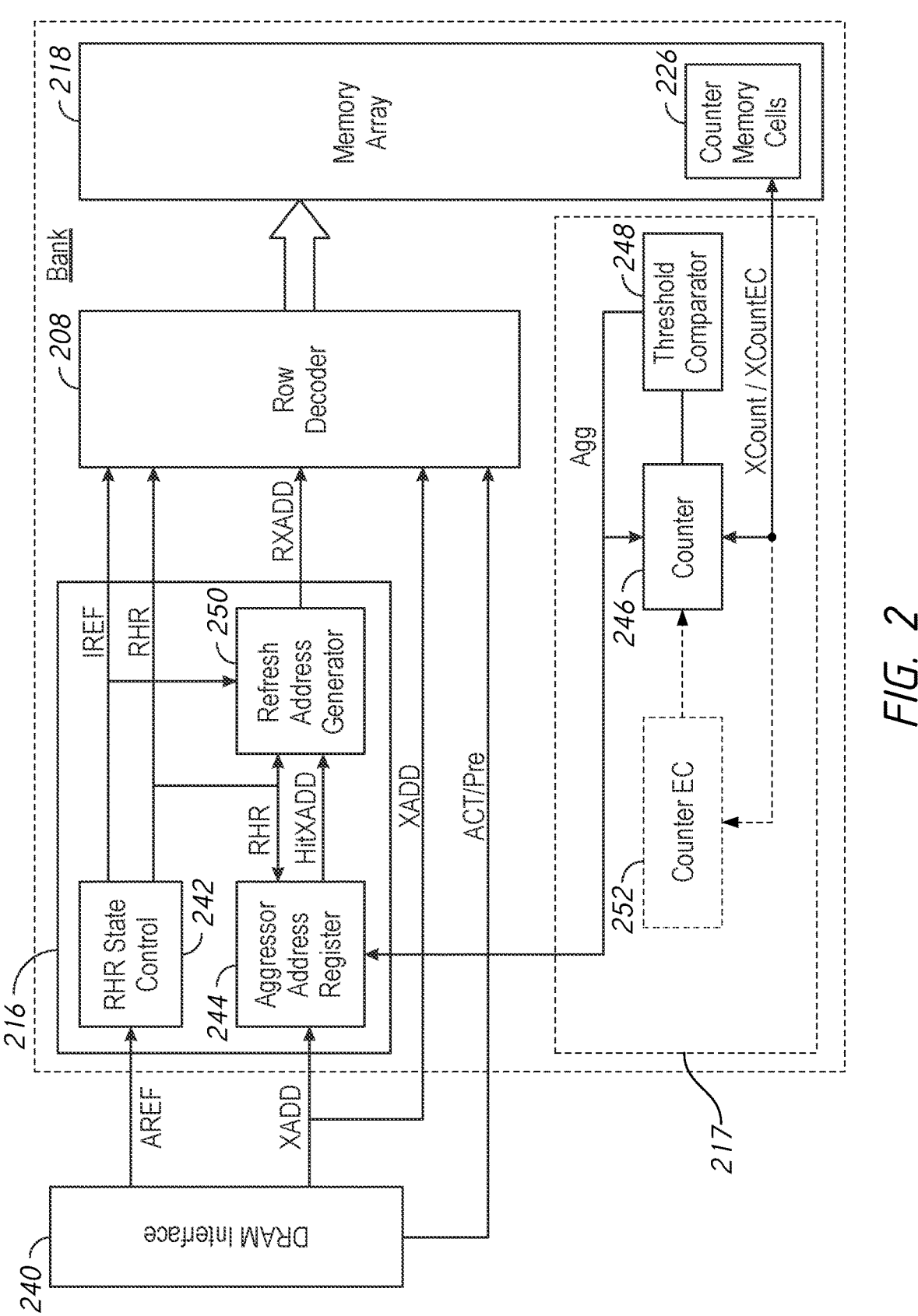
FIG. 2 is a block diagram of a refresh control circuit according to an embodiment of the present disclosure.

FIG. 2 is a block diagram of a refresh control circuit according to an embodiment of the present disclosure. FIG. 2 represents an example embodiment of how a memory may utilize word lines which include counter memory cells. FIG. 2 may show an example layout which may implement a portion of a memory device, such as the memory device 100 of FIG. 1. For example, the memory array 218 may implement the memory array 118 of FIG. 1, the row decoder 208 may implement the row decoder 108 of FIG. 1, the refresh control circuit 216 may implement the refresh control circuit 116 of FIG. 1 and so forth.

FIG. 2 shows components, such as the counter 246, count error correction circuit 252, and threshold comparator 248 grouped together as part of the refresh control circuit 216. However, one or more of these components may be spatially distributed throughout the memory. For example, the counter 246, count error correction circuit 252, and threshold comparator 248 may be spatially located in a logic region closer to each word line while the other components of the refresh control circuit may be in a bank logic region. Other distributions may be used in other example embodiments.

In some embodiments, the refresh address control circuit 216 may be used to implement the refresh address control circuit 116 of FIG. 1. Certain internal components and signals of the refresh address control circuit 216 are shown to illustrate the operation of the refresh address control circuit 216. The dotted line around the refresh address control circuit 216, the row decoder 208, and the memory array 218 is shown to represent that in certain embodiments, each of the components within the dotted line may correspond to a particular bank of memory, and that these components may be repeated for each of the banks of memory. In some embodiments, the components shown within the dotted line may be associated with each of the memory banks. Thus, there may be multiple refresh address control circuits 216 and row decoders 208. For the sake of brevity, components for only a single bank will be described.

A DRAM interface 240 may provide one or more signals to an address refresh control circuit 216 and row decoder 208 which in turn (along with a column decoder, not shown) may perform access operation on a memory array 218. The refresh address control circuit 216 may include an RHR state control 242, an aggressor address register 244, a refresh address generator 250, a counter 246, and a threshold comparator 248, and in some embodiments, an optional count error correction circuit 252. The counter 246 and count error correction circuit 252 may be coupled to counter memory cells 226 in the memory array 218.

When a row of the memory array 218 is accessed, the values of the counter memory cells 226 along that row are read to the counter 246. For example, the counter memory cells 226 may store the bits of a binary number that represents the count value. For example, if the number is a 16-bit number, then 16 counter memory cells may store the bits of the number. In some embodiments, the counter memory cells 226 may provide additional information which may be used for the count error correction circuit 252.

The counter 246 may determine a value of the access count for that row based on the values read from the counter memory cells 226. The counter 246 may be a count control circuit, which may manage a value of the count stored in the counter memory cells 226 (e.g., by reading the raw data in the counter memory cells 226 as a numerical value, writing new numerical values to the counter memory cells 226 etc.). The counter 246 may provide the count value to a threshold comparator 248, which may determine if the value of the count crosses a threshold (e.g., if the value is less than or less than or equal to the threshold). If the value does not cross the threshold (e.g., if the value is more than or equal to or more than the threshold), then the counter may decrement a value of the count and write the decremented count back to the counter memory cells 226. If the value does cross the threshold, then the current address XADD may be determined to be an aggressor address. If the current address XADD is an aggressor address, a signal Agg may be provided to the aggressor address register 244, which may record (e.g., latch) the current value of the row address XADD. If the value of the count crosses the threshold, then the counter 246 may reset a value of the count by writing an initial value of the count (e.g., 0) back to the counter memory cells 226.

In some embodiments, the memory may include an optional count error correction circuit 252. The count error correction circuit 252 may receive all or a portion of the count value XCount along with one or more redundant pieces of information XCountEC. In some embodiments, only a portion of count value XCount is subject to error correction. For example, the count error correction circuit 252 may receive a portion of the bits of the count value XCount which represent some of the most significant bits of the binary number which represents XCount. The redundant information XCountEC may be one or more extra copies of those same portion of the bits. In other words, if the overall count is an M-bit number, and the N most significant bits are protected, then XCount<M-1:M-N-1> may be saved P times as the redundant information. In other words, each of the N most significant bits may have P copies stored. The count error correction circuit 252 may be a majority voting circuit which compares each of the P copies of the N protected bits to each other and then sets all P values of that bit to the state that a majority of the P copies had. The corrected N bits are then concatenated back with the remaining M-N bits of the count value for adjustment by the counter circuit 246, and the corrected redundant copies are written back to the counter memory cells 226.

For example, if the count is an 11 bit number XCount<10:0>, and the 2 most significant bits are protected by error correction, then the counter memory cells may store XCount<10:0>, and also XCount<10:8> some number of additional times. In this example, if 2 different copies of the MSBs are saved (including the set inherent to XCount) then a total of 17 bits are stored by the counter memory cells 226 (e.g., the 11 bits of the count value and then 2 redundant MSBs twice over).

The RHR state controller 242 may provide the signal RHR to indicate that a targeted refresh operation, such as a row hammer refresh (e.g., a refresh of the victim rows corresponding to an identified aggressor row) should occur. The RHR state controller 242 may also provide an internal refresh signal IREF, to indicate that an auto-refresh operation should occur. Responsive to an activation of RHR, the aggressor address register 244 may provide an aggressor address HitXADD, and the refresh address generator 250 may provide a refresh address RXADD, which may be one or more victim addresses associated with HitXADD. Responsive to IREF, the refresh address generator 250 may provide an auto-refresh address as the refresh address RXADD. The row decoder 208 may perform a refresh operation responsive to the refresh address RXADD and the row hammer refresh signal RHR. The row decoder 208 may perform an auto-refresh operation based on the refresh address RXADD and the internal refresh signal IREF.

The DRAM interface 240 may represent one or more components which provides signals to components of the bank. In some embodiments, the DRAM interface 240 may represent a memory controller coupled to the semiconductor memory device (e.g., device 100 of FIG. 1). In some embodiments, the DRAM interface 240 may represent components such as the command address input circuit 102, the address decoder 104, and/or the command decoder 106 of FIG. 1. The DRAM interface 240 may provide a row address XADD, the auto-refresh signal AREF, an activation signal ACT, and a precharge signal Pre. The auto-refresh signal AREF may be a periodic signal which may indicate when an auto-refresh operation is to occur. The activation signal ACT may be provided to activate a given bank of the memory. The precharge signal Pre may be provided to precharge the given bank of the memory. The row address XADD may be a signal which specifies one or more particular wordlines of the memory array 218, and may be a signal including multiple bits (which may be transmitted in series or in parallel).

The counter 246 and threshold comparator 248 may work together to determine if the access count for the row associated with the current row address XADD crosses a threshold. When a given wordline is accessed, the value stored in each of the counter memory cells 226 along that wordline are read to the counter 246, which interprets the values of the counter memory cells 226 as an access count XCount. The counter 246 may interpret the memory cells 226 by determining a value of the access count XCount based on the bits stored in the counter memory cells 226. The threshold comparator 248 may compare the value of the access count XCount to a threshold value. In some embodiments, the value of the threshold may be a programmable value. The threshold comparator 248 may provide the signal Agg if the value of the count crosses the value of the threshold. If the value of the count does not cross the threshold, the counter 246 changes the value of the count, and writes the changed value back to the counter memory cells 226. If the value of the count does cross the threshold, the counter 246 may reset the value of the access count back to an initial value and write the reset value back to the counter memory cells 226.

In some embodiments, the counter may change the count by incrementing the count value, and the count may cross the threshold when the count meets or exceeds the threshold. In some embodiments, the counter 246 may change the count by decrementing the count value, and he count may cross the threshold when the count meets or falls below the threshold. In some embodiments, the counter 246 may include a first control circuit which inverts a state of each bit of the count value to generate an inverted count value. A count circuit may increase that inverted count value and a second control circuit may invert each bit of the increased inverted count value to generate a decreased count value.

In some embodiments, the counter 246 may directly determine if the value of the access count crosses a threshold, and the threshold comparator 248 may be omitted. For example, the counter may have an extremum (maximum or minimum) value, and when it increments after reaching the maximum value, or decrements after reaching the minimum value, the counter 246 may "roll over" back to an initial value. The counter 246 may provide the signal Agg responsive to rolling over. In addition, since the value of the counter resets to the initial value, the rolled over value of the counter may be written back to the counter memory cells 226 to reset them after the signal Agg flags the accessed row as an aggressor address.

In some embodiments, the counter 246 and the threshold comparator 248 may be physically close to the memory array 218, such that the counter bus XCount is relatively short compared to other buses into and out of the memory array 218. When either the comparator 248 or the counter 246 determines that value of XCount exceeds the threshold, the signal Agg may be sent to the aggressor address register 244 (and/or other components of the address refresh control circuit 216). In some embodiments, the counter 246 and the comparator 248 may be closer to the memory array 218 than the other components of the refresh address control circuit 216 (e.g., the RHR state control 242, the aggressor address register 244, and/or the refresh address generator 250). In some embodiments, the counter 246 and the threshold comparator 248 may be circuits which are local to the memory array 218, while the other components of the refresh address control circuit 216 may be bank level circuits. In some embodiments, only the signal Agg needs to run to the bank level circuits, which may reduce an area and power required for the XCount bus.

The aggressor address register 244 may store one or more row addresses which have been identified as aggressor addresses based on their access counts. Responsive to the command signal Agg from the threshold comparator 248, the aggressor address register 244 may store the current row address XADD which is being accessed. The aggressor address register 244 may provide the stored address as a match address HitXADD to the refresh address generator 250, which may calculate one or more victim addresses associated with the match address HitXADD. In some embodiments, the aggressor address register 244 may be a latch circuit which stores a single address. In some embodiments, the aggressor address register 244 may be a buffer which stores multiple addresses, and provides the first stored address as the match address HitXADD. The aggressor address register 244 may switch to a next address in the register after the victim row(s) associated with the first address have been refreshed.

The RHR state controller 242 may receive the auto-refresh signal AREF and provide the row hammer refresh signal RHR. The auto-refresh signal AREF may be periodically generated and may be used to control the timing of refresh operations. The memory device may carry out a sequence of auto-refresh operations in order to periodically refresh the rows of the memory device. The RHR signal may be generated in order to indicate that the device should refresh a particular targeted row (e.g., a victim row) instead of an address from the sequence of auto-refresh addresses. The RHR state controller 242 may use internal logic to provide the RHR signal. In some embodiments, the RHR state controller 242 may provide the RHR signal based on certain number of activations of AREF (e.g., every 4$^{th}$ activation of AREF). The RHR state controller 242 may also provide an internal refresh signal IREF, which may indicate that an auto-refresh operation should take place. In some embodiments. the signals RHR and IREF may be generated such that they are not active at the same time (e.g., are not both at a high logic level at the same time).

The refresh address generator 250 may receive the row hammer refresh signal RHR and the match address HitXADD. The match address HitXADD may represent an aggressor row. The refresh address generator 250 may determine the locations of one or more victim rows based on the match address HitXADD and provide them as the refresh address RXADD. In some embodiments, the victim rows may include rows which are physically adjacent to the aggressor row (e.g., HitXADD+1 and HitXADD−1). In some embodiments, the victim rows may also include rows which are physically adjacent to the physically adjacent rows of the aggressor row (e.g., HitXADD+2 and HitXADD−2). Other relationships between victim rows and the identified aggressor rows may be used in other examples.

The refresh address generator 250 may determine the value of the refresh address RXADD based on the row hammer refresh signal RHR and the internal auto-refresh signal IREF. In some embodiments, when the signal IREF is active, the refresh address generator 250 may provide one of a sequence of auto refresh addresses. When the signal RHR is active, the refresh address generator 250 may provide a targeted refresh address, such as a victim address, as the refresh address RXADD.

The row decoder 208 may perform one or more operations on the memory array 218 based on the received signals and addresses. For example, responsive to the activation signal ACT and the row address XADD (and IREF and RHR being at a low logic level), the row decoder 208 may direct one or more access operations (for example, a read operation) on the specified row address XADD. Responsive to the RHR signal being active, the row decoder 208 may refresh the refresh address RXADD. In some embodiments, the counter 246 may change the access count stored in the counter memory cells 226 responsive to a refresh operation of a given row. In some embodiments, the counter 246 may not change the access count responsive to a refresh operation.

Figure 3:
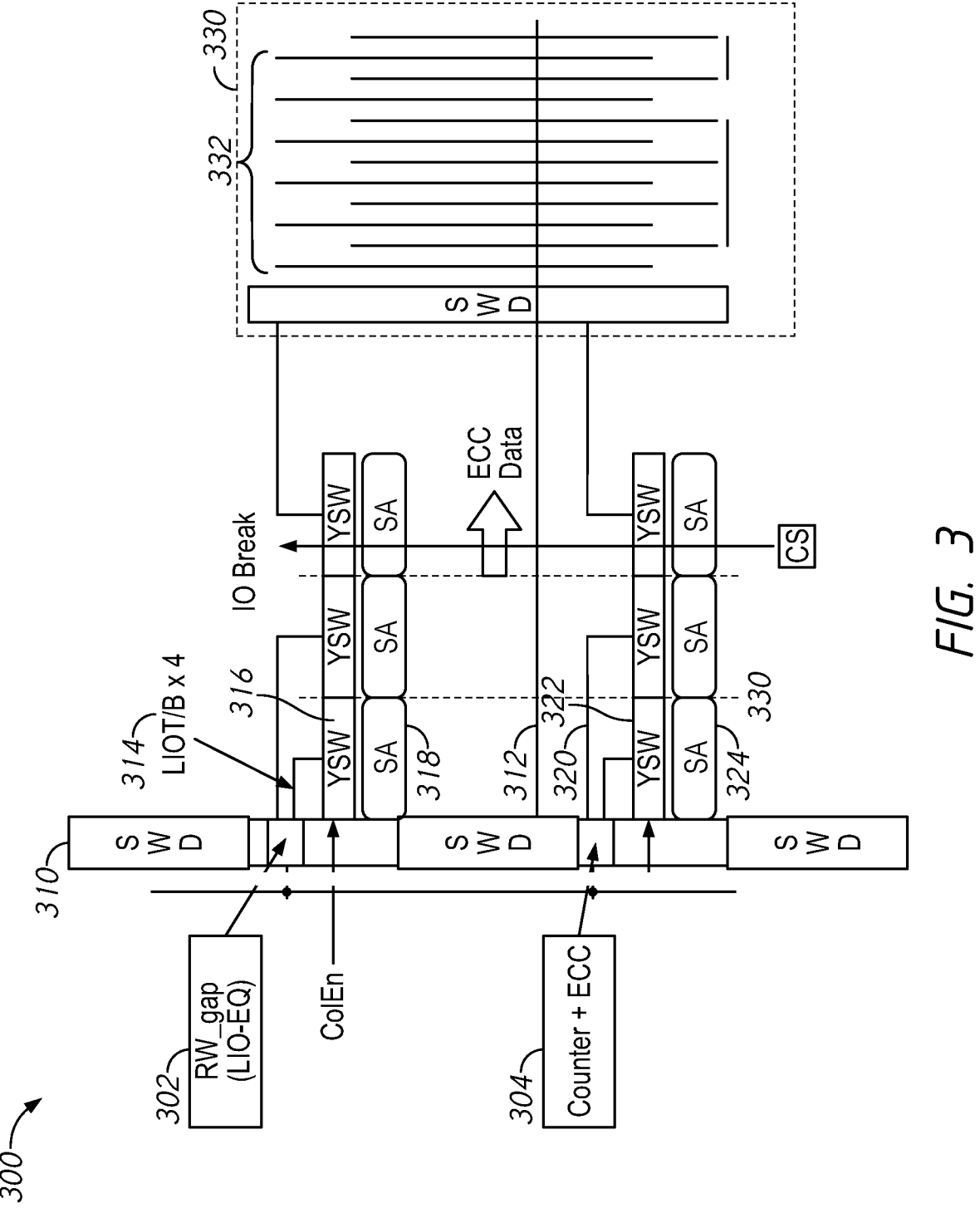
FIG. 3 is a schematic diagram of an example layout of a portion of the memory array according to some embodiments of the present disclosure.

FIG. 3 is a schematic diagram of an example layout of a portion of the memory array according to some embodiments of the present disclosure. The memory array 300 of FIG. 3 may implement the memory array 118 of FIG. 1 and/or 218 of FIG. 2 as well as showing a location of certain components in a portion of the refresh control circuit such as the components in the portion 217 of FIG. 2. The view of FIG. 3 shows certain components in a portion of the memory array used to convey the count value to and from the counter circuit and counter error correction circuit 304. Other components and signals may have been omitted and/or simplified for ease of explanation.

The portion of the memory array 300 shows a section of the memory array with a single word line 312 shown, as well as an expanded portion 330 which shows a number of bit lines, each of which may be coupled to a memory cell (not shown) at the intersection with the word line 312. The word line 312 is coupled to a sub word line driver (SWD) 306 which is positioned in a read/write gap 310 of the memory array 300. The read/write gap 310 is a region which includes logic circuits used to operate on a respective portion of the memory array.

Each bit line used to store data is coupled to a sense amplifier 318, which in turn may be driver by a driver 316. During an access operation, the sense amplifiers 318 may be selectively coupled to a local input/output line LIO (e.g., LIOT/B) 314 by a column select CS signal which is activated based on a column address. The LIO lines 315 are coupled to an equalizer driver 302 (also positioned in the RW gap 310) which drives signals along the LIO lines 314 to and from the global input/output lines GIO (not shown in FIG. 3).

In the example embodiment of FIG. 3, a portion of the refresh control circuit 304 is positioned in the read write gap 310. The portion 304 (e.g., 217 of FIG. 2) may include the counter circuit (e.g., 346), an optional threshold comparator (e.g., 348 of FIG. 3), and/or an optional count error correction circuit (e.g., 352). The counter memory cells and their respective counter bit lines 332 (e.g., as shown in the inset 330) are coupled to the portion of the refresh control circuit 304 along a bus 320 which is separate from the LIO bus used for normal data.

In an example access operation, the memory receives commands along with a row and column address. The word line 312 is activated based on the row address. The column decoder provides CS signals to couple the sense amplifiers 318 to their respective LIOs 314 and the LIO equalizer 302 either provides data onto the LIOs (a write operation) or receives data from the LIOs (a read operation). Responsive to the access operation, the column decoder also provides a CS signal which couples the sense amplifiers 324 which are coupled to the counter bit lines 332 to their respective bus 320. The information (e.g., the count value and optional redundant information) from the memory cells at the intersection of the active word line 312 and the counter bit lines 332 are read to the portion of the refresh control circuit 304, which modifies the information and then writes it back along the bus 320 and through the sense amplifiers 324 to the counter memory cells.

Figure 4:
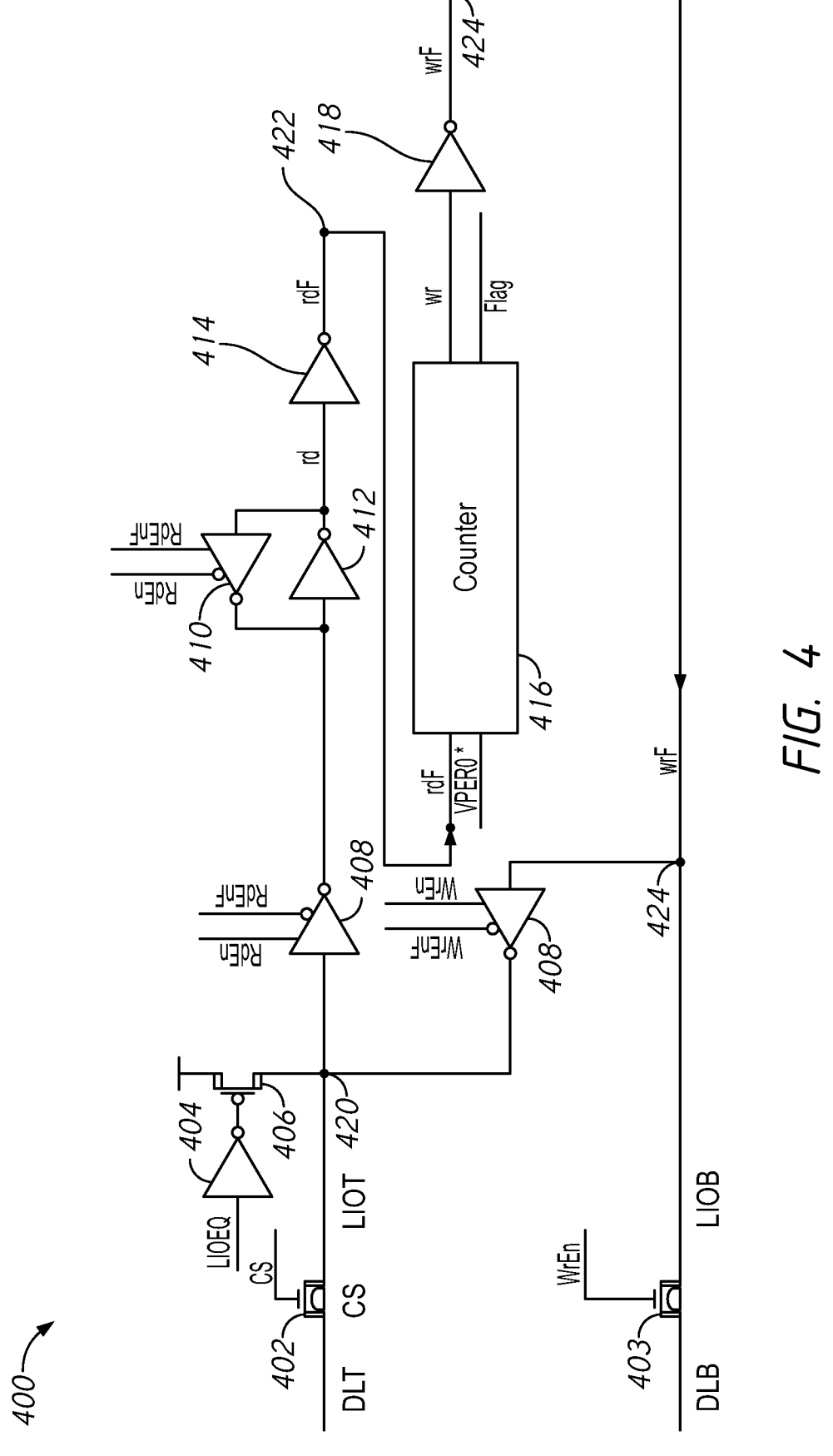
FIG. 4 is a block diagram of read/write circuitry for counter memory cells according to some embodiments of the present disclosure.

FIG. 4 is a block diagram of read/write circuitry for counter memory cells according to some embodiments of the present disclosure. The read and write circuitry 400 of FIG. 4 may, in some embodiments, represent an example implementation of the signaling path between a sense amplifier and the counter circuit (e.g., 346 of FIG. 3). An optional count error correction circuit is not shown in FIG. 4. The read and write circuitry 400 may implement a portion of the memory array 300 of FIG. 3.

The read and write circuitry 400 includes digit lines DLT and DLB which are both coupled to a sense amplifier (not shown) and also to memory cells at the intersection of word lines (also not shown). The two digit lines may be coupled to different memory cells. For example, the digit lines may extend in opposite directions from the sense amplifier. During an access operation, based on which word line is active, one digit line (here marked DLT) is coupled to a memory cell, while the other digit line (here marked DLB) acts as a reference for the sense amplifier. During an access operation, the logical value stored in the memory cell is read out by the sense amplifier, which changes the voltages on the bit line DLT and DLB based on the read logical value. For example, if the memory cell stores a logical high, then the bit line DLT is driven to a voltage (e.g., VDD, VPERI) which represents a logical high, while the bit line DLB is driven to a voltage (e.g., VSS) which represents a logical low. If the memory cell stores a logical low, then the bit line DLT is driven to a voltage which represents a logical low while the bit line DLB is driven to a voltage which represents a logical high.

The bit line DLT is coupled through a transistor 402 to a first LIO line LIOT 420 (e.g., part of 304 of FIG. 3). The transistor 402 has a gate coupled to a column select signal CS provided by the column decoder. The LIOT is coupled through an inverter 408 which is activated by read enable signal RdEn and inactivated by a complimentary read enable signal RdEnF which has the opposite logical state as RdEn. When a read operation occurs (e.g., responsive to an access, whether write or read, to the data cells along the word line), the signal RdEn is activated to couple LIOT 420 to a second inverter 412, which in turn is coupled through a first control circuit 414 to an input of a counter circuit 416. An additional inverter 410 is coupled from an output of the inverter 412 to the output of the inverter 408. The additional inverter 410 is activated by RDEnF and inactivated by RdEn. Accordingly, when a read operation is not occurring, the output and input of the inverter 412 may be coupled through inverter 410.

The first control circuit 414 may invert each bit of the read value rd to an inverted read value rdF. For example, the first control circuit 414 may include a number of inverter circuits each of which receives a bit of rd and provides a corresponding bit of rdF. For example, if rd has a value of <111> then rdF may have a value of <000>. More or fewer bits of rd and rdF may be used in other example embodiments.

The first control circuit 414 provides the counter 416 with rdF, an inverse of the bits of the count value XCount. The counter circuit 416 may increase the inverted count value rdF and to generate an increased inverted count value. In the embodiment of FIG. 4, the counter circuit 416 provides the non-inverted count value wr (in other words, the counter circuit 416 may act as a control circuit or may include a second control circuit similar to the control circuit 414). The non-inverted count value wr may be decreased relative to the count value rd (e.g., decremented). The non-inverted (or updated) count value wr is provided to a second control circuit 418. The second control circuit 418 may be generally similar to the first control circuit 414. The second control circuit 418 inverts each bit of the decreased count value wr to generate an updated inverted count value wrF. Inverting the count value rd (e.g., XCount) to an inverse rdF, increasing that inverse and inverting again (e.g., whether inherent to the counter 416 or a separated circuit) may output a decremented updated value of wr (e.g., XCount'). The counter circuit 416 provides a signal Flag (e.g., Agg of FIG. 2) if the count value 'rolls over' from a maximum value back to a minimum value. This may in turn both indicate that a threshold has been reached and also reset the count value.

The second control circuit 418 provides the bits of the updated count value XCount' as an inverse write value wrF. The inverse write value wrF is provided to an input of another control circuit 408 which is active when a write enable signal WrEn is active, and inactive when an inverse write enable signal WrEnF which has an opposite logical state to WrEn is active. The write enable signal WrEn may be activated a time after the read enable signal RdEn. A transistor 403 couples the inverse write value wrF to the digit line DLB. Similarly the inverse of the value wrF (e.g., wr) is written to the digit line DLT. Since the digit line DLB is complimentary, the digit line DLB is driven to an opposite of the write value (wrF), while the digit line DLT is driven to the true value (e.g., a bit of XCount'). In this way the read/write circuitry 400 reads out the value of XCount, inverters it to an inverse value which is incremented, inverts it again and then writes that updated value back to the digit lines.

FIG. 4 shows an embodiment where the counter circuit 416 outputs the true write value wr (e.g., after the inverse read value rdF is incremented to generate wrF, the counter inverts to provide wr instead). Accordingly, the read and write circuitry incudes two additional control circuits 418 and 408 to invert the true write value wr to the inverse wrF and then back to wr. In some embodiments, the counter circuit 416 may provide the inverse write value wrF, and only a single control circuit (e.g., either 418 or 408) may be used. For example, in some embodiments, the counter circuit 416 may provide wrF and the control circuit 418 may be eliminated.

An additional inverter circuit 404 and transistor 406 are used to equalize the LIOT 420. When a signal LIOEQ is at a high logical level, the inverter provides a logical low to a gate of transistor 406, which couples a system voltage VPERI to the LIOT 420.

Figure 5:
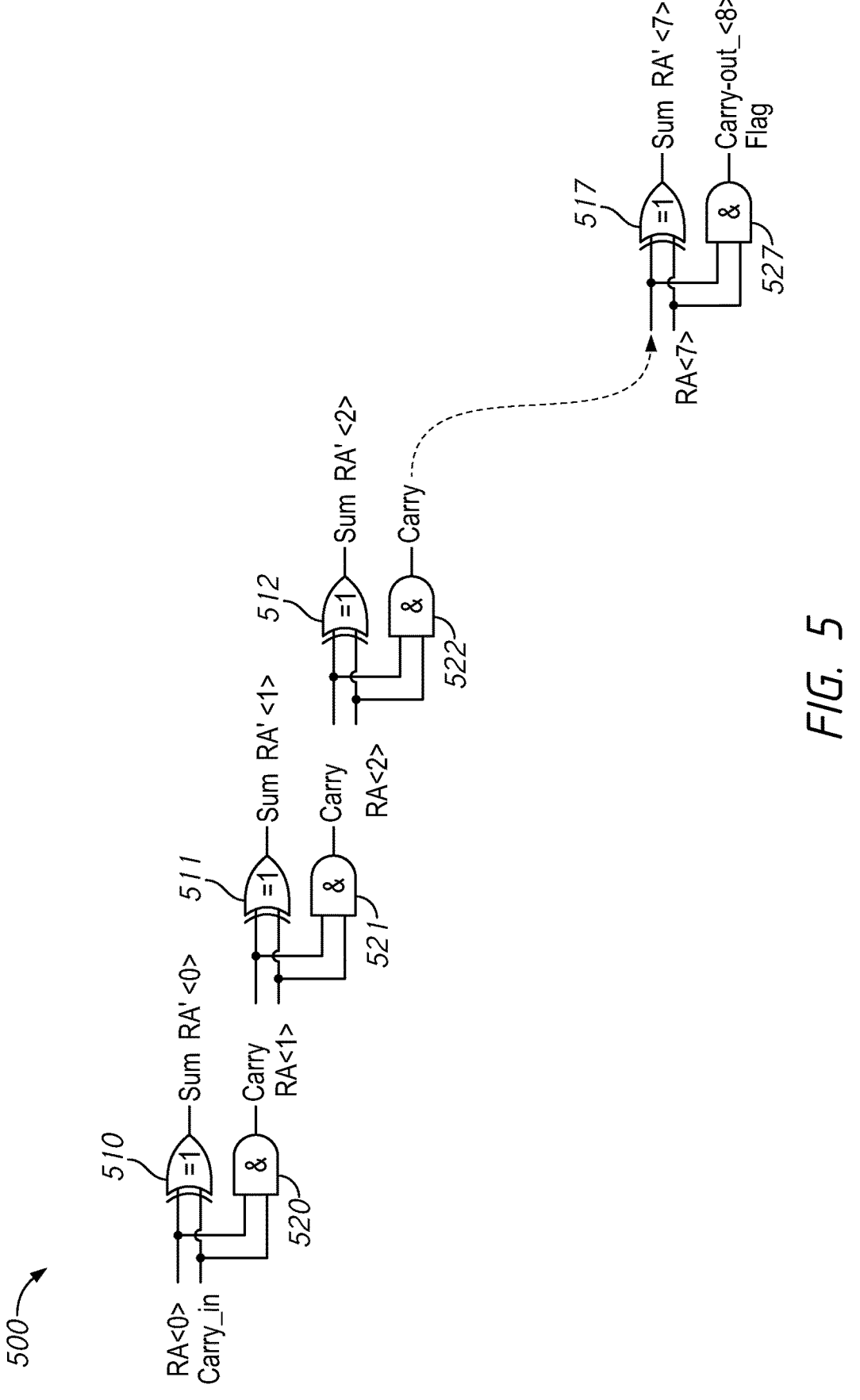
FIG. 5 is a schematic diagram of a counter circuit according to some embodiments of the present disclosure.

FIG. 5 is a schematic diagram of a counter circuit according to some embodiments of the present disclosure. The counter circuit 500 may, in some embodiments, implement the counter circuit 246 of FIG. 2 and/or 416 of FIG. 4. The count circuit 500 receives an inverted count value (e.g., such that each bit of the count value is inverted) increments it (e.g., increases the binary number those bits represent by one) and then outputs a value which may be inverted to yield a decremented count value. The counter circuit receives an input RA (e.g., the output of first control circuit 414 of FIG. 4) and provides an updated value RA' (e.g., the input of the second control circuit 418 of FIG. 4).

The counter circuit includes a number of XOR gates 510-517 and a number of AND gates 520-527. The number of logic gates may be based on the number of bits of the count value. In the example of FIG. 5, the count value is 8 bits and an 8 bit counter is used. More or fewer bits and more or fewer logic gates may be used in other example embodiments.

Each of the XOR gates 510-517 and each of the AND gates 520-527 receive a respective bit of RA (the inverted count value) and a carry bit. All of the gates except the first receive the carry bit as the output of the previous AND gate. So the gates 511 and 521 receive a carry bit Carry<1> from the AND gate 520, the gates 512 and 522 receive a carry bit Carry<2> from the AND gate 521 and so forth. The first pair of gates 510 and 520 receive an input bit Carry_in which may be set to a logical high. Each XOR gate 510-517 provides an updated bit RA' (e.g., an inverse of the updated count value).

In an example operation, the count value may be 9 or XCount=<00000101>. The count value may be inverted such that RA=<11111010>(e.g., a value of 250). The bits of RA are input to the counter circuit 500. The first bit RA<0>=0 and is input to the XOR 510 along with a logical high as the input Carry_in. Since the values are different, the output of the XOR 510 is RA'<0>=1. Since the bits are different, the AND gate 510 provides an output Carry<1>=0. While the rest of the outputs will not be described in detail, the counter circuit will output RA'=<11111011> (a value of 251). This in turn will be inverted to XCount'=<00000100>, a value of 8.

Figure 6:
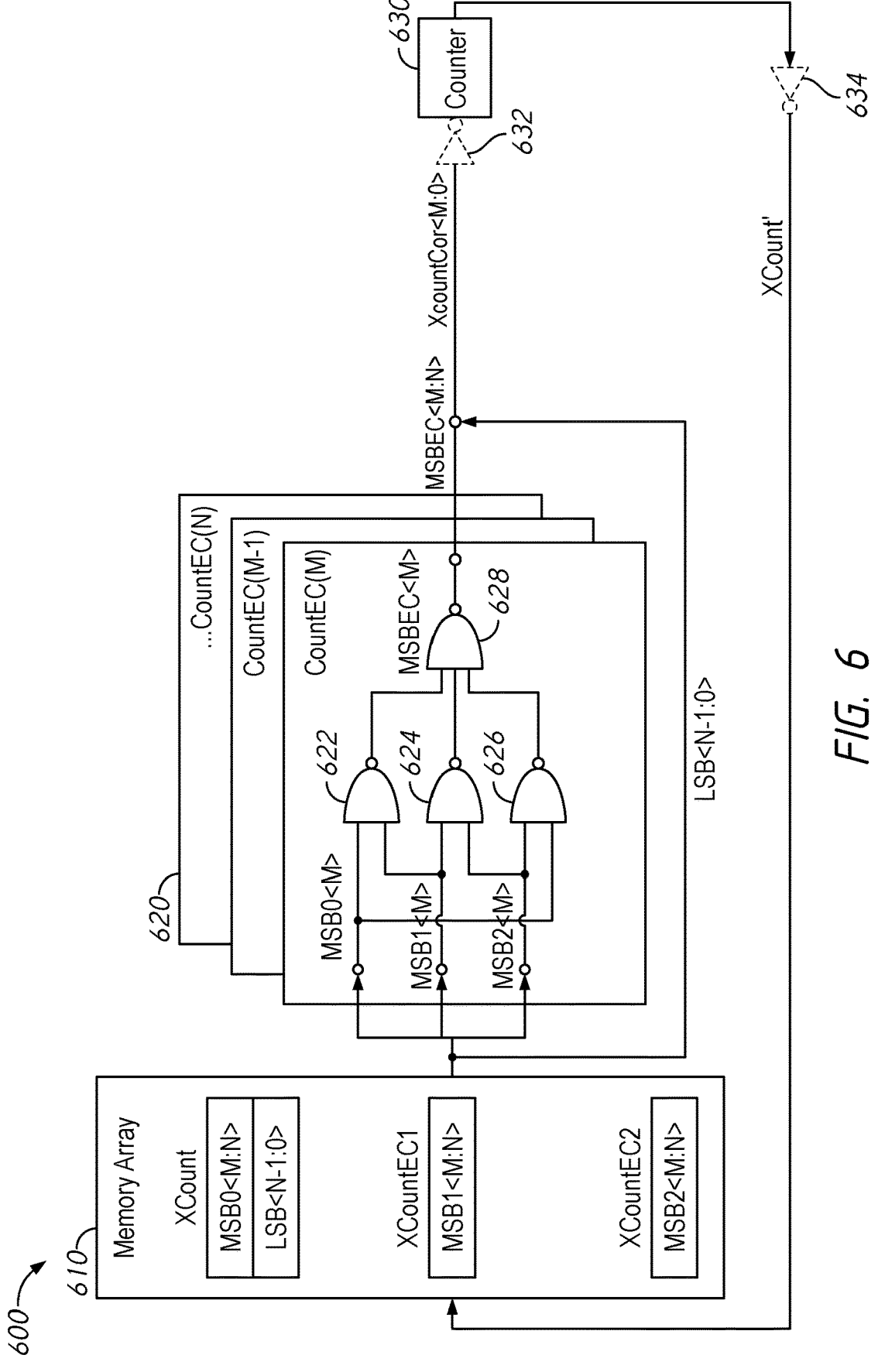
FIG. 6 is a block diagram of a read write circuitry for an access count with error correction according to some embodiments of the present disclosure.

FIG. 6 is a block diagram of a read write circuitry for an access count with error correction according to some embodiments of the present disclosure. The read/write circuitry 600 may implement a portion of a memory device such as 100 of FIG. 1. The read/write circuitry 600 shows a counter circuit 630 which may be the counter 246 of FIG. 2, 416 of FIG. 4, and/or 500 of FIG. 5 and a count error correction circuit 620 which may implement the count error correction circuit 252 of FIG. 2. For example, the read/write circuitry 600 may show a simplified view of the read/write circuitry 400 of FIG. 4. The view of FIG. 6 omits several components and signals which were described in more detail with respect to FIG. 4. For the sake of brevity those features will not be described in detail again here.

A memory array 610 stores a count value XCount<M:0>. The count value may be separated into a set of most significant bits MSB which are protected by error correction and a set of least significant bits LSB which are not. For example, if XCount is Xcount<M:0> then it may be divided into MSB<M:N> and LSB<N-1:0>. The bits which are protected (e.g., MSB) may be stored multiple times as redundant information. In the example of FIG. 6, three copies of the MSB are saved, one copy which is part of XCount and two additional redundant copies. Here the three different versions of the MSB are labelled MSB0 (e.g., the one which is part of XCount), MSB1, and MSB2. More or fewer copies may be saved in other example embodiments.

The contents of the three copies should ideally be identical to each other. For example MSB0<M>= MSB1<M>=MSB2<M>, MSB0<M-1>=MSB1<M-1>= MSB2<M-1> and so forth. However, errors in the memory array 610, such as those caused by a neutron strike, may change a state of the bits. The error correction circuit 620 may attempt to restore the changed information.

During an access operation, the count value XCount (MSB0+LSB) is read out, along with the redundant information MSB1 and MSB2. The sets of corresponding redundant bits are each provided to a count error correction circuit 620. In the embodiment of FIG. 6, the count error correction circuit 620 includes a majority voting circuit (e.g., logic gates 622-628) for each set of bits. There may be a majority voting circuit for each bit of the MSB. Since the majority voting circuits may generally be similar to each other, only one will be described in detail.

The majority voting circuit includes a first NAND gate 622, a second NAND gate 624, a third NAND gate 626, and a fourth NAND gate 628. The majority voting circuit receives the three copies of one of the bits of MSB as well as its two redundant copies. In this example, MSB0<M>as well as MSB1<M> and MSB2<M>. The first NAND gate 622 has input terminals coupled to MSB0<M> and MSB1<M>. The second NAND gate 624 has input terminals coupled to MSB1<M> and MSB2<M>. The third NAND gate 626 has input terminals coupled to MSB2<M> and MSB0<M>. The outputs of the three NAND gates 622-626 are coupled to input terminals of the fourth NAND gate 628. The fourth NAND gate 628 provides a corrected bit MSBEC<M> as an output.

Accordingly, the overall output will be a logical high if at least one input is a logical low, and a logical low if all the inputs are a logical high. Each of the NAND gates 622-626 will similarly provide a logical high if their two inputs include at least one logical low and will provide a logical low if both inputs are logical high. The circuit may act overall as a majority voting circuit, which sets a value of the output based on the state of two or more of the inputs. For example, Table 1, below lists the possible inputs and outputs of the majority voting circuit:

TABLE 1

| Inputs and Outputs of Majority Voting Circuit | | | |
|---|---|---|---|
| Input A (MSB0) | Input B (MSB1) | Input C (MSB2) | Output (MSBEC) |
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 1 |

In this manner, the output may match a state of a majority of the input bits. Since the odds that two out of three of the copies of the information fail is relatively low, the output may correct errors in the stored MSB bits. The corrected information MSBEC is rejoined with the LSB information read out from the memory array 610 to form a corrected count value XCountCor. The corrected count value is provided to a count circuit 630 (e.g., 246 of FIG. 2, 416 of FIG. 4, and/or 500 of FIG. 5) which provides an updated count value XCount'. The updated count value XCount' is written back to the memory array 610 and the MSB of the updated count value are copied and used to overwrite the redundant information.

In some embodiments, the count circuit may increment the count, and the corrected count value XCountCor is directly provided to the count circuit. In some embodiments (e.g., similar to discussed with respect to FIGS. 4 and 5) control circuits 632 and 634 (e.g., 414 and 418 of FIG. 4) may be used to invert the corrected count value, increment that value, and then invert again to lead to an overall decrement of the corrected count value. The control circuits 632 and 634 may include a number of inverter circuits which invert a logical state of each bit of the received count value or the inverted corrected count value.

Figure 7:
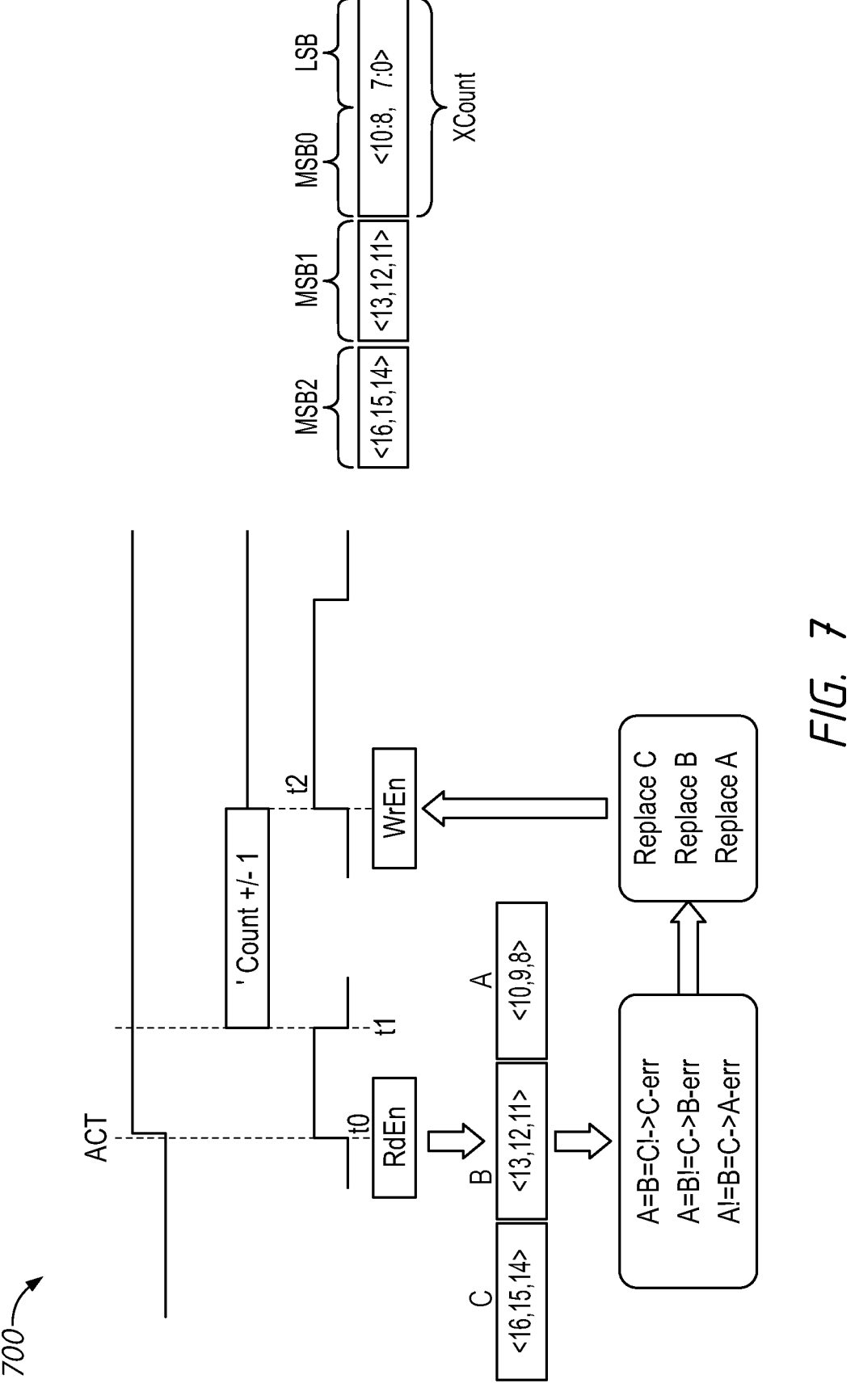
FIG. 7 is a timing diagram of a count change operation with count error correction according to some embodiments of the present disclosure.

FIG. 7 is a timing diagram of a count change operation with count error correction according to some embodiments of the present disclosure. The timing diagram 700 is a schematic representation of an operation, and various horizontal time scales are relative. The timing diagram 700 represents an operation where the memory stores the count value XCount as an 11 bit number (XCount<10:0>) and protects the three most significant bits (XCount<10:8>) with two additional redundant copies.

At an initial time t0, the memory performs an access operation on a row of the memory, and the activation signal ACT becomes active. Responsive to ACT at an active level, the row is opened. The command and column decoder may issue various commands. and at the initial time the signal RdEn is activated for counter bit lines. Accordingly, the value XCount is read out along with the redundant information. The most significant bits MSB0-MSB2 are provided to the error correction circuit (e.g., 620 of FIG. 6), which checks the three versions of each bit against each other and corrects as needed.

At a first time t1, the read enable signal is switched to an inactive state while the count value is changed either up or down. At a second time t2, the write enable signal is activated, and the updated (and corrected) values are written back to the memory array.

Figure 8:
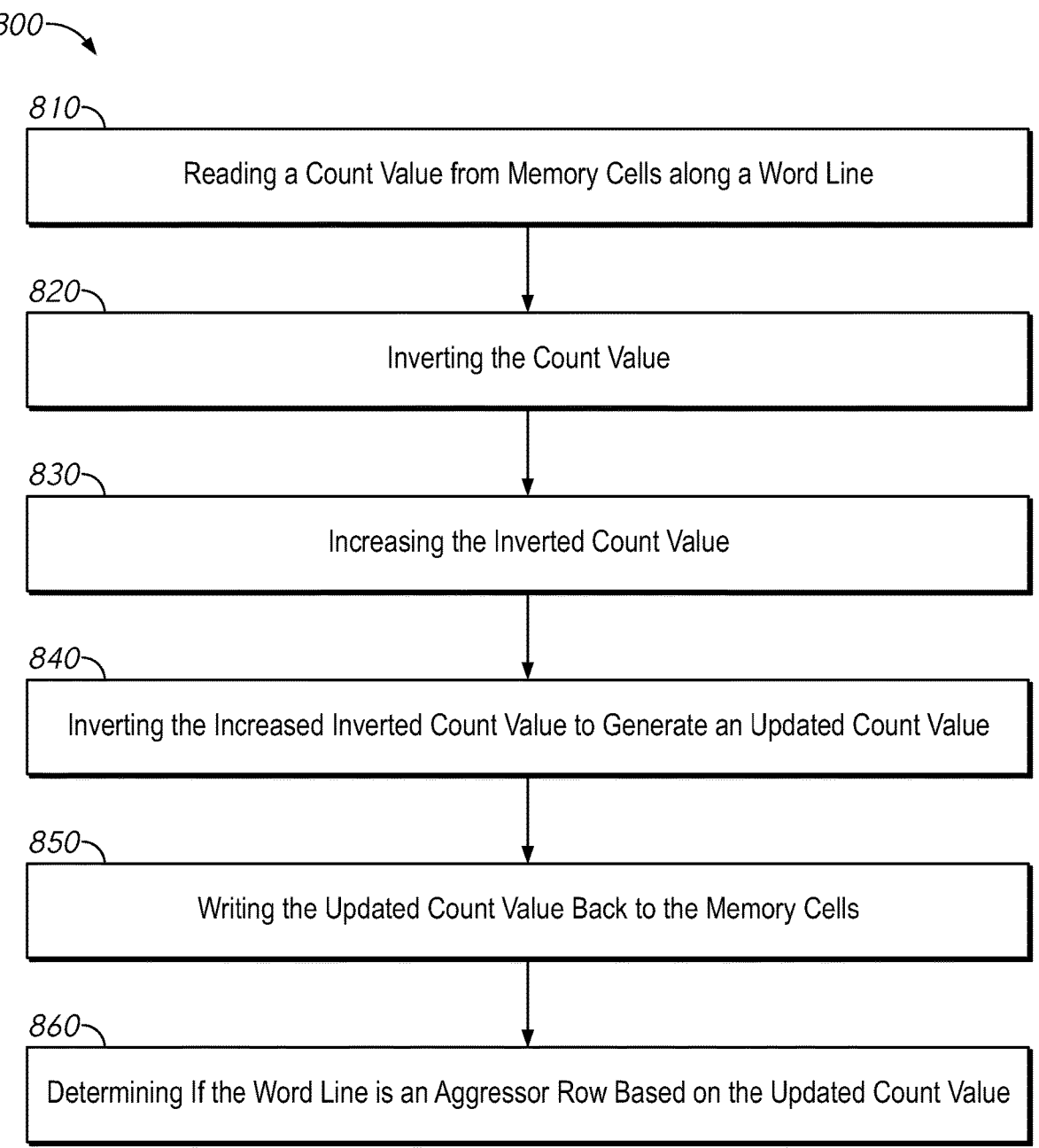
FIG. 8 is a flow chart of a method of using a decreasing row count value according to some embodiments of the present disclosure.

FIG. 8 is a flow chart of a method of using a decreasing row count value according to some embodiments of the present disclosure. The method 800 may be implemented by one or more of the systems or apparatuses described herein. For example, the method 800 may be implemented by a refresh control circuit of a memory device such as the memory device 100 of FIG. 1. The count adjustment operations may be performed by a portion of a refresh control circuit such as the portion 217 of FIG. 2.

The method 800 includes box 810 which describes reading a count value from memory cells along a word line. The reading may be responsive to an access operation (e.g., either a read or a write operation) to other memory cells along the word line. The count value may be stored in a plurality of memory cells, such as counter memory cells 126, along the word line as a binary number. The method 800 may include reading out the count value to a refresh control circuit such as 116 of FIG. 1, 216 and/or 217 of FIG. 2, and/or 304 of FIG. 3. For example, the method 800 may include reading the bits of the count value out along digit lines (e.g., DLT of FIG. 4).

The box 810 may be followed by box 820, which describes inverting the count value. For example each bit of the count value may be passed through an inverter circuit, such as the inverter 414 of FIG. 4 and/or 632 of FIG. 6. The method 800 may include generating an inverted count value by inverting a logical state of each bit of the count value.

Box 820 may be followed by box 830, which describes increasing the inverted count value. For example, a count circuit such as 346 of FIG. 3, 416 of FIG. 4, 500 of FIG. 5, and/or 630 of FIG. 6 may change the count value. In some embodiments, the inverted count value may be incremented (e.g., increased by one). In some embodiments, if the inverted count value was at a maximum value, then by increasing the inverted count value the inverted count value may be reset to an initial value (e.g., 0) and a flag signal may be provided.

Box 830 may be followed by box 840, which describes inverting the increased inverted count value to generate an updated count value. For example each bit of the count value may be passed through an inverter circuit, such as the inverter 418 of FIG. 4 and/or 634 of FIG. 6. The method 800 may include generating an updated count value by inverting a logical state of each bit of the inverted updated count value. The updated count value may be decreased (e.g., decremented) relative to the count value.

Box 840 may be followed by box 850, which describes writing the updated count value back to the memory cells. For example, the method may include providing each bit of the updated count value back to the counter bit lines (e.g., 126 of FIG. 1 and/or DLT and DLB of FIG. 4). The method 800 may include providing each bit to a complimentary bit line (e.g., DLB) and an inverted bit to a bit line (e.g., DLT) coupled to a sense amplifier.

Box 850 may be followed by box 860, which describes determining if the word line is an aggressor row based on the updated count value. For example, the method 800 may include determining that the word line is an aggressor row if the count value falls below a threshold. For example, if the inverted count value is reset and the flag signal is provided (e.g., in box 840) then the flag signal may be used to indicate that the word line is an aggressor. The method 800 may include storing a row address (e.g., in aggressor register 244 of FIG. 2) associated with the word line responsive to the determination that the word line is an aggressor. The method may include refreshing one or more addresses based on the row address in the aggressor address register as part of a targeted refresh operation. For example the method may include generating refresh addresses based on the stored row address.

FIG. 9 is a flow chart of a method of correcting count values according to some embodiments of the present disclosure. The method 900 may be implemented by one or more of the systems or apparatuses described herein. For example, the method 900 may be implemented by a refresh control circuit of a memory device such as the memory device 100 of FIG. 1. The correction may be performed by a count error correction circuit such as 252 of FIG. 2, 304 of FIG. 3, and/or 620 of FIG. 6.

The method 900 begins with box 910, which describes storing a count value and redundant information in memory cells along a word line. The count value may be based on a number of accesses to the word line. The count value may be stored as bits in counter memory cells along counter bit lines (e.g., 126 of FIG. 1) which intersect the word line. The redundant information may represent one or copies of all or a portion of the bits of the count value. For example, the redundant information may be represent additional copies of some number of the most significant bits of the count value.

Box 910 may be followed by box 920, which describes reading the count value and the redundant information responsive to an access operation on the word line. For example, the method 900 may include performing a read or write operation on other memory cells along the word line and reading the count value and the redundant information responsive to the read or write operation on the other memory cells.

Box 920 may be followed by box 930, which describes correcting the count value based on the count value and the redundant information. For example, the method 900 may include comparing a bit of the count value to corresponding bits of the redundant information and correcting the count value based on a majority of the values of the bit and the corresponding bits (e.g., with a correction circuit such as 620 of FIG. 6). The method 900 may include separating the count value into a first portion (e.g., the MSB) which corresponds to the redundant information, and a second portion which does not correspond (e.g., the LSB), correcting the first portion (e.g., correcting the MSB with majority voting circuit 620 of FIG. 6) and then joining the corrected first portion to the second portion to form the corrected count value.

Box 930 may be followed by box 940, which describes changing the corrected count value. For example, with a count circuit such as 346 of FIG. 3. In some embodiments, the count value may be increased. In some embodiments the count value may be decreased. In some embodiments the method 900 may include determining if the word line is an aggressor row based on determining if the count value has crossed a threshold. The method 900 may include storing a row address (e.g., in aggressor register 244 of FIG. 2) associated with the word line responsive to the determination that the word line is an aggressor. In some embodiments, the method 900 may include refreshing one or more other word lines based on the word line as part of a targeted refresh operation if the word line is determined to be an aggressor. For example the method 900 may include generating one or more refresh addresses based on the row address in the aggressor register.

Box 940 may be followed by box 950, which describes writing the changed corrected count value as the count value and a portion of the changed corrected count value as the redundant information to the memory cells along the word line. For example the method 900 may include a portion of the most significant bits of the count value as the redundant information.

In some embodiments, an example memory device of the present disclosure may use both decreasing counting and count error correction. For example, the methods 800 and 900 may be combined, with the steps 820-860 of FIG. 8 being performed as part of the boxes 940-950 of FIG. 9.

It is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
a word line intersecting a plurality of memory cells which are configured to store a count value;
a first control circuit configured to receive the count value as part of an access operation on the word line and invert a logical state of the bits of the count value to generate an inverted count value;
a count circuit configured to increase the inverted count value to generate an updated inverted count value;
a second control circuit configured to receive the updated inverted count value and invert a logical state of the bits of the updated inverted count value to generate an updated count value, wherein the updated count value is written back to the plurality of memory cells.

2. The apparatus of claim 1, wherein the updated count value is decremented from the count value.

3. The apparatus of claim 1, wherein the count circuit is configured to provide an aggressor signal at an active level when the updated inverted count value exceeds a threshold; the apparatus further comprising:
an aggressor address register configured to store a row address associated with the word line responsive to aggressor signal at the active level.

4. The apparatus of claim 3, wherein the threshold is based on a maximum value of the count value.

5. The apparatus of claim 3, further comprising a refresh address generator configured to generate one or more refresh addresses based on the row address in the aggressor address register responsive to a targeted refresh operation.

6. The apparatus of claim 1, further comprising:
a second plurality of memory cells configured to store redundant information based on the count value; and
a count error correction circuit configured to correct the count value based on the count value and the redundant information responsive to the access operation.

7. A method comprising:
reading a count value from memory cells along a word line, wherein the count value is associated with a number of accesses to the word line;
inverting the count value;
increasing the inverted count value;
inverting the increased inverted count value to generate an updated count value;
writing the updated count value back to the memory cells; and
determining if the word line is an aggressor row based on the updated count value.

8. The method of claim 7, further comprising:
accessing information in other memory cells along the word line; and
reading the count value responsive to the accessing.

9. The method of claim 7, further comprising:
determining if a row address associated with the word line is an aggressor address based on the increased inverted count value; and
storing the row address in an aggressor address register if the row address is an aggressor address.

10. The method of claim 9, further comprising:
refreshing one or more addresses based on the row address in the aggressor address register as part of a targeted refresh operation.

11. The method of claim 7, further comprising:
reading redundant information from extra memory cells along the word line, wherein the redundant information is based on the count value; and correcting the count value with a count error correction circuit based on the count value and the redundant information.

12. An apparatus comprising:

a word line intersecting a plurality of memory cells which are configured to store a count value and redundant information, wherein the redundant information represents at least a portion of the bits of the count value;

a count value correction circuit configured to receive the count value and the redundant information and to generate a corrected count value based on the count value and the redundant information;

a counter circuit configured to update the corrected count value and determine if the word line is an aggressor based on the updated corrected count value, wherein the updated corrected count value is written back to the plurality of memory cells as the count value and the at least a portion of the bits of the corrected count value is written back to the plurality of memory cells as the redundant information.

13. The apparatus of claim 12, wherein the counter circuit is configured to identify the word line as an aggressor based on the corrected count value rolling over to an initial value.

14. The apparatus of claim 12, wherein responsive to the counter circuit identifying the word line as an aggressor, a row address associated with the word line is stored in an aggressor address register.

15. The apparatus of claim 14, further comprising a refresh address generator configured to generate one or more refresh address based on the row address in the aggressor address register responsive to a targeted refresh operation.

16. The apparatus of claim 12, wherein the count value correction circuit comprises a majority voting circuit configured to set a value of the corrected count value based on a majority of the values of the at least a portion of the count value and the redundant information.

17. The apparatus of claim 12, wherein the redundant information is one or more copies of a portion of the most significant bits of the count value.

18. The apparatus of claim 12, wherein the count value correction circuit is configured to receive the count value as part of an access operation to other memory cells intersecting the word line.

19. The apparatus of claim 12, further comprising:

a first control circuit configured to invert the corrected count value and provide the inverted count value to the counter circuit; and a second control circuit configured to receive the updated corrected count value from the counter circuit and provide an inverted updated corrected count value to the plurality of memory cells.

* * * * *